(12) United States Patent
Lee et al.

(10) Patent No.: US 7,244,649 B2
(45) Date of Patent: Jul. 17, 2007

(54) METHOD OF MANUFACTURING A CAPACITOR HAVING IMPROVED CAPACITANCE AND METHOD OF MANUFACTURING A SEMICONDUCTOR DEVICE INCLUDING THE CAPACITOR

(75) Inventors: Jae-Dong Lee, Suwon-si (KR); Chang-Ki Hong, Sungnam-si (KR); Young-Rae Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 11/007,443

(22) Filed: Dec. 9, 2004

(65) Prior Publication Data
US 2005/0130385 A1    Jun. 16, 2005

(30) Foreign Application Priority Data
Dec. 10, 2003   (KR) .................. 10-2003-0089397

(51) Int. Cl.
*H01L 21/8242*   (2006.01)

(52) U.S. Cl. ............... 438/253; 438/243; 438/244; 438/386; 438/387; 438/396

(58) Field of Classification Search ............... 438/243, 438/244, 253, 386, 387, 396, FOR. 220, 438/FOR. 430
See application file for complete search history.

(56) References Cited

U.S. PATENT DOCUMENTS

| 5,763,286 | A | * | 6/1998 | Figura et al. ............ 438/255 |
| 6,107,153 | A | * | 8/2000 | Huang et al. ............ 438/389 |
| 6,200,898 | B1 | * | 3/2001 | Tu ........................ 438/692 |
| 6,319,822 | B1 | * | 11/2001 | Chen et al. ............ 438/637 |
| 6,482,696 | B2 | | 11/2002 | Park |
| 6,878,600 | B2 | * | 4/2005 | Birner et al. ............ 438/386 |
| 2002/0009847 | A1 | * | 1/2002 | Watanabe ............... 438/239 |

FOREIGN PATENT DOCUMENTS

| JP | 2001210804 | 8/2001 |
| KR | 1020020021816 A | 3/2002 |
| KR | 1020030067821 A | 8/2003 |

* cited by examiner

*Primary Examiner*—George Fourson
*Assistant Examiner*—Joannie Adelle García
(74) *Attorney, Agent, or Firm*—Volentine & Whitt, PLLC

(57) ABSTRACT

A method for manufacturing a capacitor is disclosed. An etch-stop layer or a polishing stop layer is employed to protect a storage electrode of the capacitor from being damaged by a chemical mechanical polishing process or an etch-back process during its fabrication.

22 Claims, 19 Drawing Sheets

METHOD OF MANUFACTURING A CAPACITOR HAVING IMPROVED CAPACITANCE AND METHOD OF MANUFACTURING A SEMICONDUCTOR DEVICE INCLUDING THE CAPACITOR

BACKGROUND OF THE INVENTION

1. Field of the Invention

The present invention relates generally to a method for manufacturing a capacitor and a method for manufacturing a semiconductor device incorporating the capacitor. More particularly, the present invention relates to a method for manufacturing a capacitor without damaging a storage electrode thereof, and a method for manufacturing a semiconductor device incorporating the capacitor.

A claim of priority is made to Korean Patent Application No. 2003-89397 filed on Dec. 10, 2003, the disclosure of which is incorporated herein by reference in its entirety.

2. Description of the Related Art

As the level of integration in conventional semiconductor memory devices increases, the area taken up by a single memory cell unit in a semiconductor memory device decreases accordingly. To ensure sufficient storage capacitance in the semiconductor memory device, a capacitor generally takes on one of various shapes such as a box, a fin, a crown, or a cylinder. One conventional capacitor comprises a cylindrical storage electrode connected to a contact pad formed on a semiconductor substrate. Such a capacitor having a cylindrical storage electrode is typically formed using a mold layer. A conventional method for forming a capacitor using a mold layer is disclosed, for example, in U.S. Pat. No. 6,482,696, Japanese Laid Open Patent Publication No. 2001-210804, and Korean Laid Open Patent Publication No. 2003-67821.

FIGS. 1A through 1E are cross-sectional views illustrating a method for forming a conventional capacitor using a mold layer.

Referring to FIG. 1A, an insulating interlayer 5 is formed on a semiconductor substrate (not shown) including contact regions. The insulating interlayer 5 is then partially etched by a photolithography process to form openings that expose the contact regions in the semiconductor substrate.

A first conductive layer of polysilicon or metal is formed on the insulating interlayer 5 to fill the openings. The first conductive layer is etched by a chemical mechanical polishing (CMP) process or an etch-back process until the insulating interlayer 5 is exposed, thereby forming contacts 10 filling the openings.

An etch-stop layer 15, a mold layer 20, and a mask layer are successively formed on the insulating interlayer 5 and the contacts 10. A photoresist pattern 30 is then formed on the mask layer.

Using the photoresist pattern 30 as an etching mask, the mask layer is patterned to form a storage electrode mask 25 on the mold layer 20. The mold layer 20 and the etch-stop layer 15 are partially etched using the storage electrode mask 25 such that storage electrode contact holes 35 are formed through the mold layer 20 and the etch-stop layer 15. The storage electrode contact holes 35 expose the contacts 10.

Referring to FIG. 1B, the photoresist pattern 30 is removed by an ashing and/or stripping process and a second conductive layer 40 of doped polysilicon is formed on the contacts 10, on inner sidewalls of the storage electrode contact holes 35 and on the storage electrode mask 25.

Referring to FIG. 1C, a sacrificial oxide layer 50 is formed on the second conductive layer 40, thereby filling the storage electrode contact holes 35.

Referring to FIG. 1D, storage electrodes 60, which are electrically connected to contacts 10, are formed using a CMP process. The CMP process is used to remove portions of the sacrificial oxide layer 50, the second conductive layer 40, and the storage electrode mask 25, until the mold layer 20 is exposed. Each of the storage electrodes 60 has a cylindrical shape with a patterned sacrificial layer 55 filling a gap between sections of the cylindrical storage electrode 60.

Referring to FIG. 1E, the storage electrodes 60 are completed by removing the mold layer 20 and the patterned sacrificial layer 55. Dielectric layers 65 and plate electrodes 70 are then successively formed on the storage electrodes 60 to form capacitors 75 on the semiconductor substrate.

The method described above has at least one significant shortcoming. In forming the capacitors 75 using the mold layer 20, an upper portion of the resulting storage electrodes 60 is removed by the CMP process which is applied to remove the storage electrode mask 25. When this upper portion of the storage electrode 60 is removed, the effective area of the storage electrode 60 is reduced, thus reducing the overall capacitance of the capacitor 75.

SUMMARY OF THE INVENTION

The present invention provides a method for forming a capacitor without damage to a constituent storage electrode.

The present invention also provides a method for manufacturing a semiconductor device including the capacitor.

According to one aspect of the present invention, a method for manufacturing a capacitor is provided. The method comprises; forming a first etch-stop layer and a mold layer on a semiconductor substrate including a conductive structure, forming a second etch-stop layer on the mold layer, forming a mask on the second etch-stop layer, forming a contact hole exposing the conductive structure using the mask, forming a storage electrode contacting the conductive structure in the contact hole, and successively forming a dielectric layer and a plate electrode on the storage electrode.

According to another aspect, the present invention provides a method for manufacturing a capacitor. The method comprises; forming an etch-stop layer and a mold layer on a semiconductor substrate including a conductive structure, forming a polishing stop layer on the mold layer, forming a mask on the polishing stop layer, forming a contact hole exposing the conductive structure using the mask, forming a conductive layer contacting the conductive structure in the contact hole, forming a storage electrode in the contact hole by removing the mask until the polishing stop layer is exposed, removing the polishing stop layer and the mold layer, and successively forming a dielectric layer and a plate electrode on the storage electrode.

According to still another aspect, the present invention provides a method for manufacturing a semiconductor device. The method comprises; forming a first contact region and a second contact region on a semiconductor substrate, forming a bit line contacting the second contact region on the semiconductor substrate, successively forming an insulating interlayer, a first etch-stop layer and a mold layer on the semiconductor substrate including the bit line, forming a second etch-stop layer on the mold layer, forming a mask on the second etch-stop layer, forming a contact hole exposing the first contact region by partially etching the second etch-stop layer, the mold layer, the first etch-stop layer and the insulating interlayer, using the mask, forming a storage electrode in the contact hole, and forming a dielectric layer and a plate electrode on the storage electrode.

According to the present invention, an additional etch-stop layer or polishing stop layer is employed to protect a storage electrode of a capacitor from being removed. The additional etch-stop layer or polishing stop layer storage electrode protect the storage electrode, particularly an upper portion of the storage electrode, from being removed, thereby improving a capacitance of the capacitor. The thickness of the additional etch-stop layer or polishing stop layer relative to a storage electrode mask used to form the storage electrode prevent the storage electrode from being damaged and also allow the additional etch-stop layer or polishing stop layer to be readily removed.

BRIEF DESCRIPTION OF THE DRAWINGS

The accompanying drawings illustrate one or more preferred embodiments of the present invention and are incorporated in and constitute a part of this specification. In the drawings:

FIGS. 2 through 10 are cross-sectional views illustrating a method for manufacturing a semiconductor device including a capacitor according to one aspect of the present invention.

DETAILED DESCRIPTION OF THE INVENTION

Figure 1A:
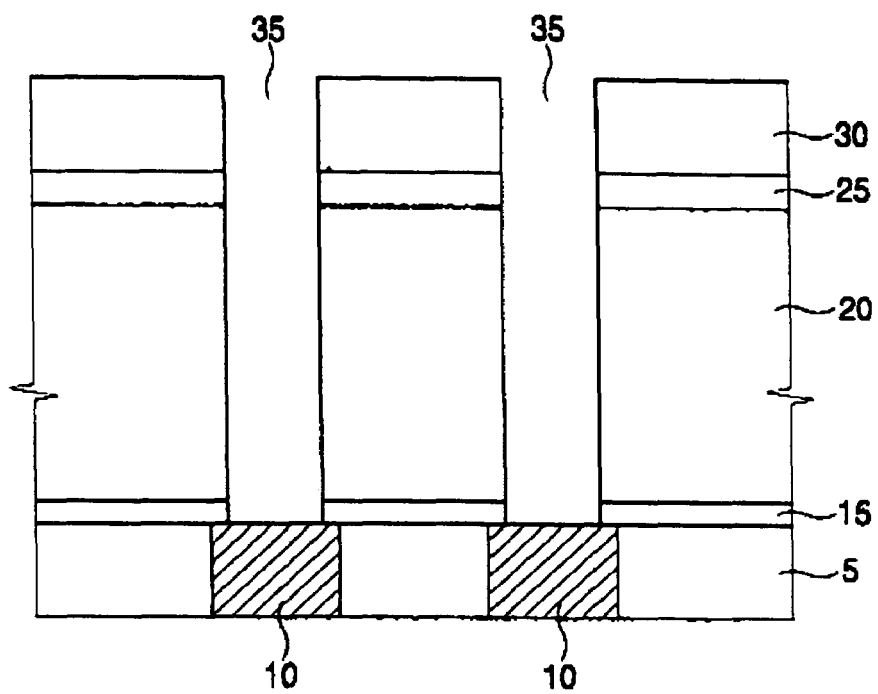
FIGS. 1A through 1E are cross-sectional views illustrating a method for forming a conventional capacitor using a mold layer.
Figure 1B:
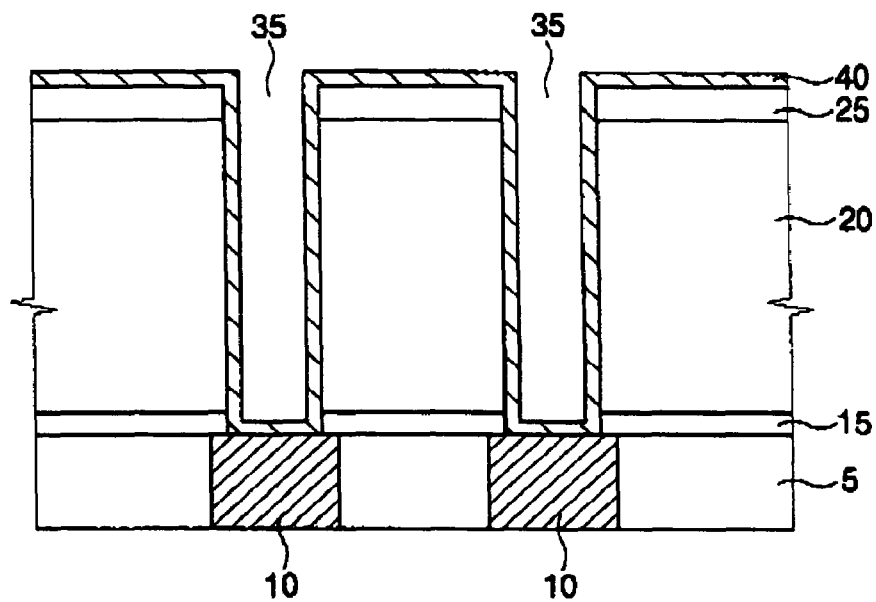
Figure 1C:
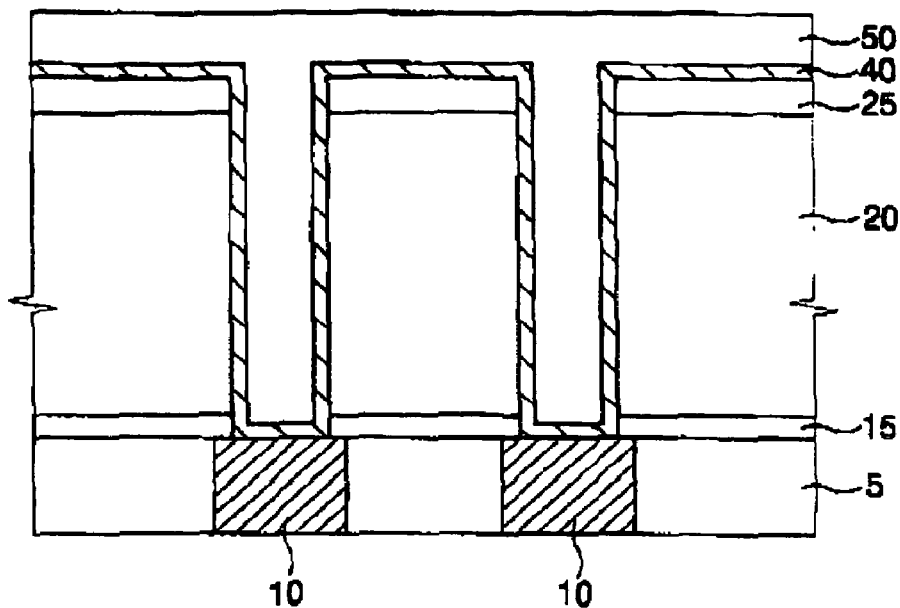
Figure 1D:
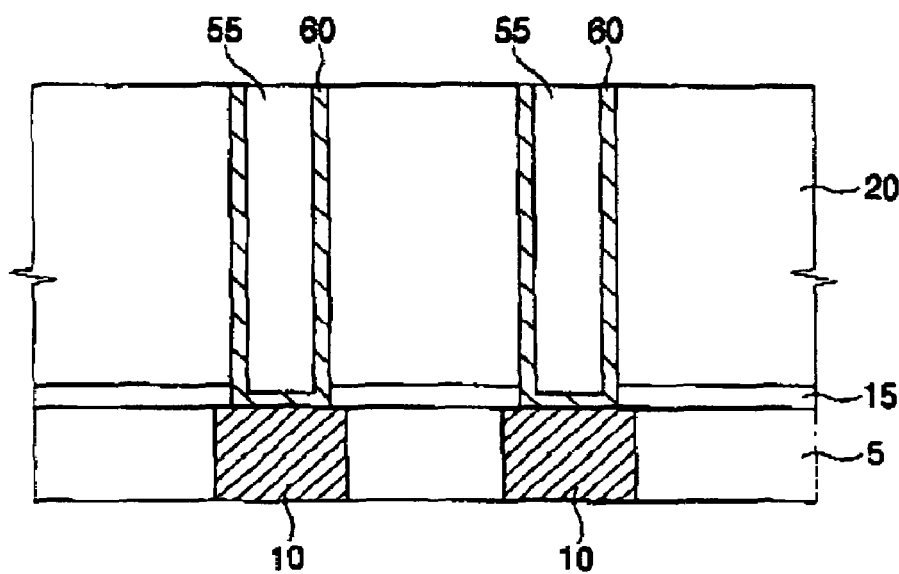
Figure 1E:
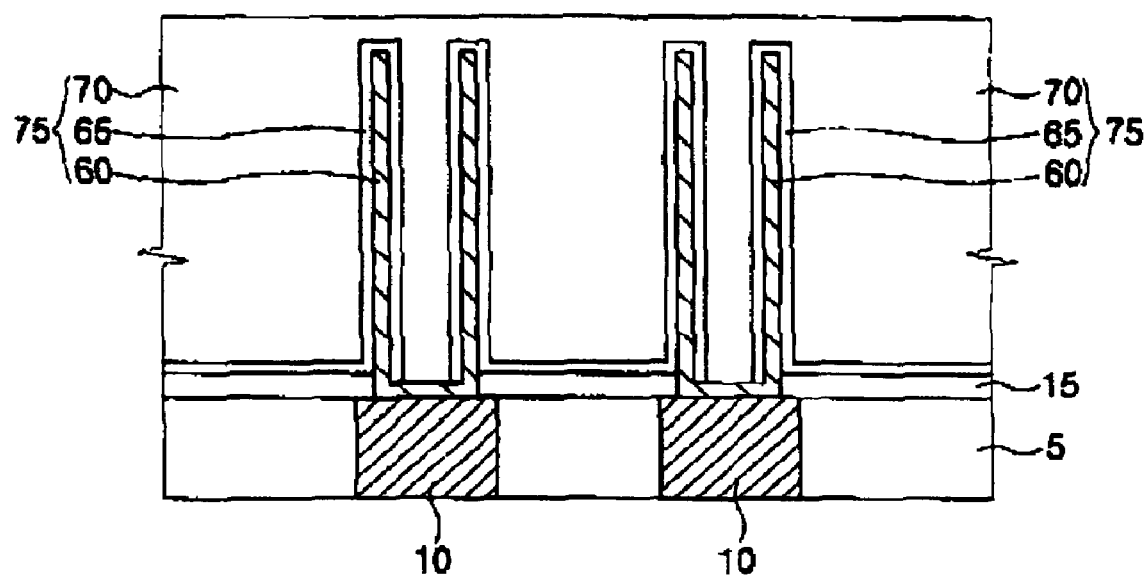

The present invention will now be described more fully with reference to the accompanying drawings in which one or more preferred embodiments of the present invention are shown. In the drawings, the thickness of layers and regions are exaggerated for clarity and like reference numerals refer to like elements throughout. It will be understood that when an element such as a layer, region, or substrate is referred to as being "on" or "onto" another element, the layer is either directly on the other element or intervening elements may also be present.

FIGS. 2 through 10 are cross-sectional views illustrating a method for manufacturing an exemplary semiconductor memory device including a capacitor according to one aspect of the present invention. FIGS. 2A through 10A show related cross-sectional views of the semiconductor memory device taken along a line parallel to bit lines of the semiconductor device. FIGS. 2B to 10B are related cross-sectional views of the semiconductor memory device taken along a line parallel to word lines of the semiconductor device.

Figure 2A:
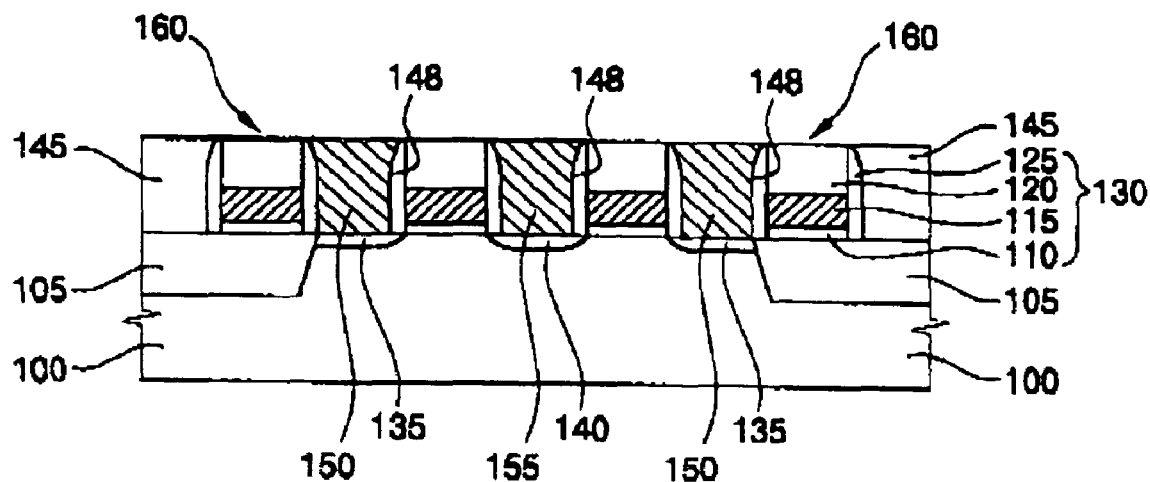
FIGS. 2A and 2B are cross-sectional views illustrating the formation of word lines, first pads, and second pads on a semiconductor substrate.
Figure 2B:
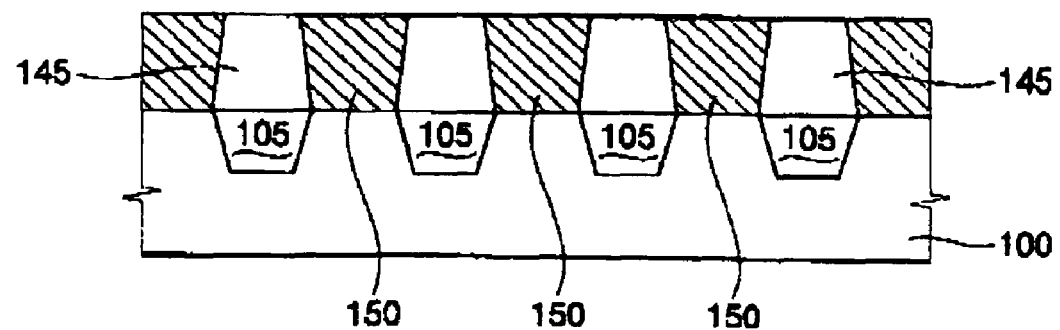

FIGS. 2A and 2B are cross-sectional views illustrating the formation of word lines, first pads, and second pads on a semiconductor substrate. Referring to FIGS. 2A and 2B, a semiconductor substrate 100 is divided into an active region and a field region by forming an isolation layer 105 on surface portions of semiconductor substrate 100. The isolation layer 105 is typically formed by an isolation process such as a shallow trench isolation (STI) process or a local oxidation of silicon (LOCOS) process.

A thin gate oxide layer (not shown) is formed on the semiconductor substrate 100 and the isolation layer 105 by a thermal oxidation process or a chemical vapor deposition (CVD) process.

A first conductive layer (not shown) and a first mask layer (not shown) are successively formed on the gate oxide layer. The first conductive layer is typically formed using a conductive material such as polysilicon doped with impurities. Alternatively, the first conductive layer may have a polycide structure that includes a doped polysilicon film and a metal silicide film formed on the doped polysilicon film. The first conductive layer is patterned to form a gate conductive pattern 115. The first mask layer is formed using a material having an etch selectivity relative to a first insulating interlayer 145. For example, where the first insulating interlayer 145 includes oxide, the first mask layer is formed using nitride, such as silicon nitride. The first mask layer is patterned to form a gate mask pattern 120.

A first photoresist pattern (not shown) is formed on the first mask layer. Then, the first mask layer, the first conductive layer and the thin gate oxide layer are partially etched using the first photoresist pattern as an etching mask to form gate structures 130 on the semiconductor substrate 100. Each gate structure 130 includes the gate mask pattern 120, the gate conductive pattern 115, and the gate oxide pattern 110. That is, the first mask layer, the first conductive layer and the thin gate oxide layer are successively etched to form the gate structures 130 on the semiconductor substrate 100.

According to one aspect of the present invention, the first mask layer is etched using the first photoresist pattern as an etching mask such that the gate mask pattern 120 is formed on the first conductive layer. The first photoresist pattern is removed from the gate mask pattern 120 by an ashing and/or stripping process and then the first conductive layer and the thin gate oxide layer are successively etched using the gate mask pattern 120 as an etching mask, thus forming the gate structures 130, which includes the gate oxide pattern 110, the gate conductive pattern 115 and the gate mask pattern 120.

A first insulation layer (not shown) is formed on the semiconductor substrate 100 to cover the gate structures 130. The first insulation layer is preferably formed using nitride such as silicon nitride. The first insulation layer is anisotropically etched to form first spacers 125 on respective sidewalls of the gate structures 130. The first spacers 125 correspond to gate spacers.

Impurities are implanted into surface portions of the semiconductor substrate 100 exposed between the gate structures 130, including the first spacers 125. The impurities are preferably implanted by an ion implantation process using the gate structures 130 as masks. The implanted impurities are thermally treated to form first contact regions 135 and second contact regions 140 in the exposed portions of the semiconductor substrate 100. The first and second contact regions 135 and 140 correspond to respective source/drain regions in exemplary metal oxide semiconductor (MOS) transistors.

A combination of the above-described elements forms a plurality of word lines 160 on the semiconductor substrate 100. The word lines 160 comprise the MOS transistors having the gate structures 130, the first contact regions 135, and the second contact regions 140. Adjacent word lines 160 are electrically separated by the first spacers 125 and the gate mask patterns 120. The first and second contact regions 135 and 140 correspond to capacitor contact regions and bit line contact regions, respectively. Capacitors 270 (see FIGS. 10A and 10B) are electrically connected to the capacitor contact regions, whereas bit lines 190 (see FIG. 3B) are electrically connected to the bit line contact regions. For example, the first contact regions 135 are typically the capacitor contact regions to which first pads 150 are electrically connected, whereas the second contact regions 140 are typically the bit line contact regions to which second pads 155 are electrically connected.

The first insulating interlayer 145 is formed on the semiconductor substrate 100 to cover the word lines 160. The first insulating interlayer 145 typically comprises oxide such as boro-phosphor silicate glass (BPSG), phosphor silicate glass (PSG), undoped silicate glass (USG), spin on glass (SOG), tetraethylorthosilicate (TEOS), or high density plasma-chemical vapor deposition (HDP-CVD) oxide.

A second photoresist pattern (not shown) is formed on the first insulating interlayer 145. The first insulating interlayer 145 is partially etched using the second photoresist pattern as an etching mask to form first contact holes 148 exposing the first and second contact regions 135 and 140, respectively. Preferably, the first insulating interlayer 145, which typically comprises oxide, is etched using an etching gas having an etch selectivity relative to the gate mask pattern 120 which typically comprises nitride.

First contact holes 148 are formed through the first insulating interlayer 145 by a self-alignment process, i.e., the first contact holes 148 are self-aligned relative to the word lines 160, which include the first spacers 125. Some first contact holes 148 expose the first contact regions 135 corresponding to the capacitor contact regions while other first contact holes 148 expose the second contact regions 140 corresponding to the bit line contact regions.

The second photoresist pattern is removed by an ashing and/or stripping process. Then, a second conductive layer (not shown) is formed on the first insulating interlayer 145 to fill the first contact holes 148. The second conductive layer may be formed using conductive material such as polysilicon heavily doped with impurities or metal.

The second conductive layer is etched by a CMP process, an etch-back process, or a combination of a CMP process and an etch-back process, until the first insulating interlayer 145 is exposed. First and second pads 150 and 155, which fill the first contact holes 148, are formed on the first and second contact regions 135 and 140, respectively. Each of the first pads 150 corresponds to a first storage node contact pad, and each of the second pads 155 corresponds to a first bit line contact pad. Because the first contact holes 148 are formed by the self-alignment process, the first and second pads 150 and 155 typically correspond to self-aligned contact (SAC) pads. As described above, the first pads 150 are electrically connected to the first contact regions 135, which correspond to the capacitor contact regions, and the second pads 155 are electrically connected to the second contact regions 140, which correspond to the bit line contact regions.

The first insulating interlayer 145 is typically planarized by a chemical mechanical polishing (CMP) process, an etch-back process, or a combination of a CMP process and an etch-back process. Following planarization, the first insulating interlayer 145 typically has a predetermined thickness measured from upper faces of the word lines 160. Alternatively, the first insulating interlayer 145 is etched until upper faces of the word lines 160 are exposed. Where the first insulating interlayer 145 is etched until the upper faces of the word lines 160 are exposed, the second conductive layer (not shown) is etched until the upper faces of the word lines 160 are exposed so that the first and second pads 150 and 155 are formed in the first contact holes 148. The first and second pads 150 and 155 typically have heights substantially equal to those of the word lines 160.

Figure 3A:
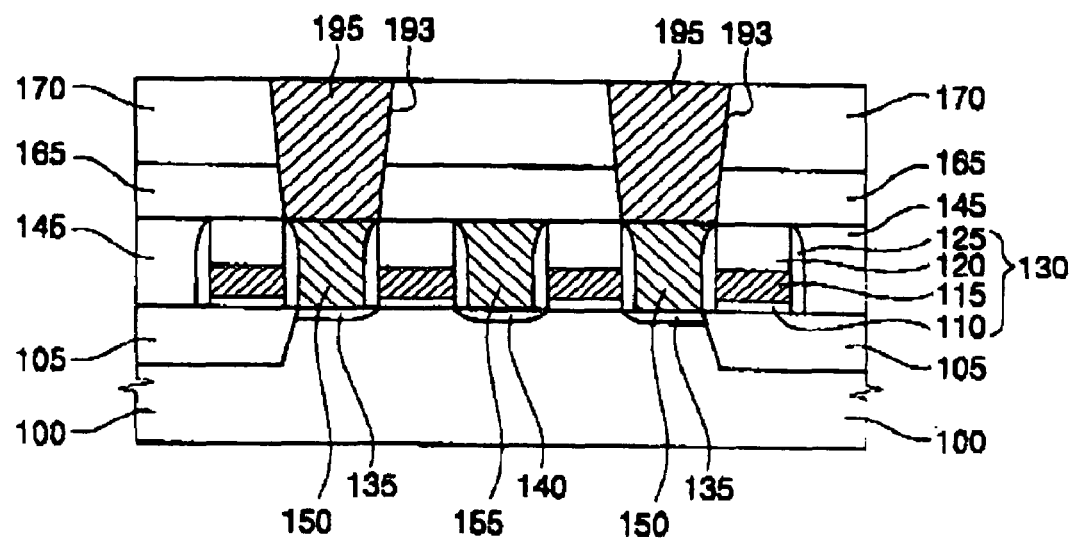
FIGS. 3A and 3B are cross-sectional views illustrating the formation of bit lines and fourth pads.
Figure 3B:
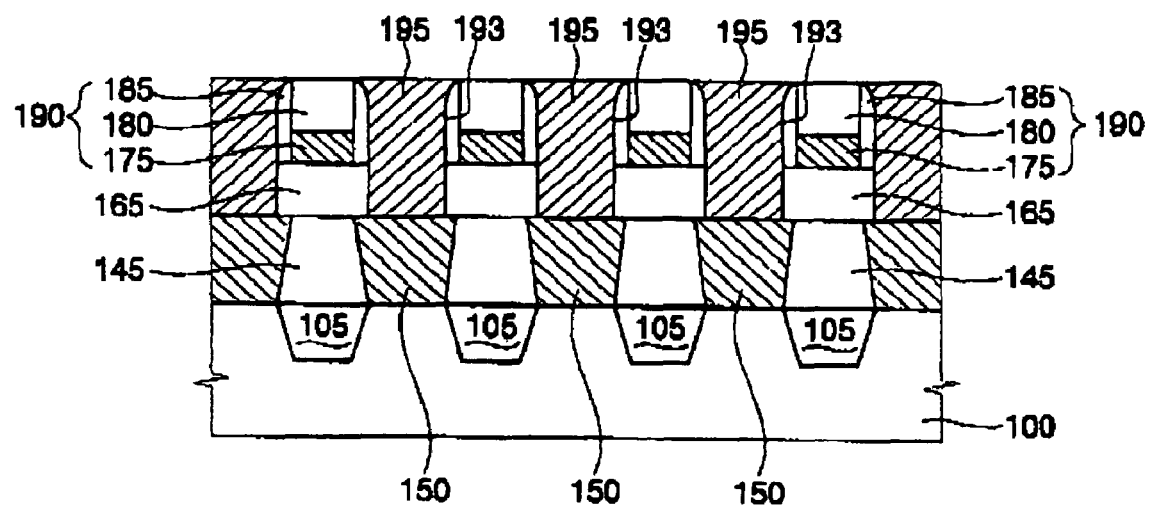

FIGS. 3A and 3B are cross-sectional views illustrating the formation of bit lines 190 and fourth pads 195.

Referring to FIGS. 3A and 3B, a second insulating interlayer 165 is formed on the first insulating interlayer 145. The second insulating interlayer 165 electrically isolates the first pads 150 from the bit lines 190, which are successively formed on the second insulating interlayer 165. The second insulating interlayer 165 is preferably formed using BPSG, PSG, SOG, USG, TEOS, or HDP-CVD oxide. The material used to form the second insulating interlayer 165 is typically substantially identical to that used to form the first insulating interlayer 145. However, the material used to form the second insulating interlayer 165 is often substantially different from that of the first insulating interlayer 145. The second insulating interlayer 165 is typically planarized by a CMP process, an etch-back process, or a combination of a CMP process and an etch-back process so as to ensure a process margin of a subsequent photolithography process.

A third photoresist pattern (not shown) is formed on second insulating interlayer 165. The second insulating layer 165 is then partially etched using the third photoresist pattern as an etching mask to form second contact holes (not shown) exposing the second pads 155. The second contact holes correspond to bit line contact holes electrically connecting the second pads 155 to the bit lines 190.

According to one aspect of the present invention, a first anti-reflective layer (ARL) is additionally formed between the second insulating interlayer 165 and the third photoresist pattern to efficiently ensure a process margin in the photolithography process. The first ARL may be formed using silicon oxide, silicon nitride or silicon oxynitride. The photolithography process may be carried out to form the second contact holes through the second insulating interlayer 165.

The third photoresist pattern is removed by an ashing and/or stripping process. A third conductive layer (not shown) and a second mask layer (not shown) are then successively formed on the second insulating interlayer 165. The second contact holes are filled with the third conductive layer. The third conductive layer and the second mask layer are patterned to form a bit line conductive pattern 175 and a bit line mask pattern 180, respectively.

A fourth photoresist pattern (not shown) is formed on the second mask layer. The second mask layer and the third conductive layer are subsequently etched using the fourth photoresist pattern as an etching mask to form the bit lines 190 on the second insulating interlayer 165. When the third conductive layer is etched to form the bit line conductive pattern 175, third pads filling the second contact holes are simultaneously formed. Each of the bit lines 190 includes the bit line mask pattern 180 and the bit line conductive pattern 175. The third pads correspond to second bit line contact pads electrically connecting the second pads 155 to the bit lines 190. Additionally, the third pads correspond to bit line contact plugs. The bit line conductive pattern 175 typically comprises a first film and a second film formed on the first film. The first film generally comprises metal or metal compounds such as titanium/titanium nitride (Ti/TiN) and the second film generally comprises metal such as tungsten (W).

Figure 5A:
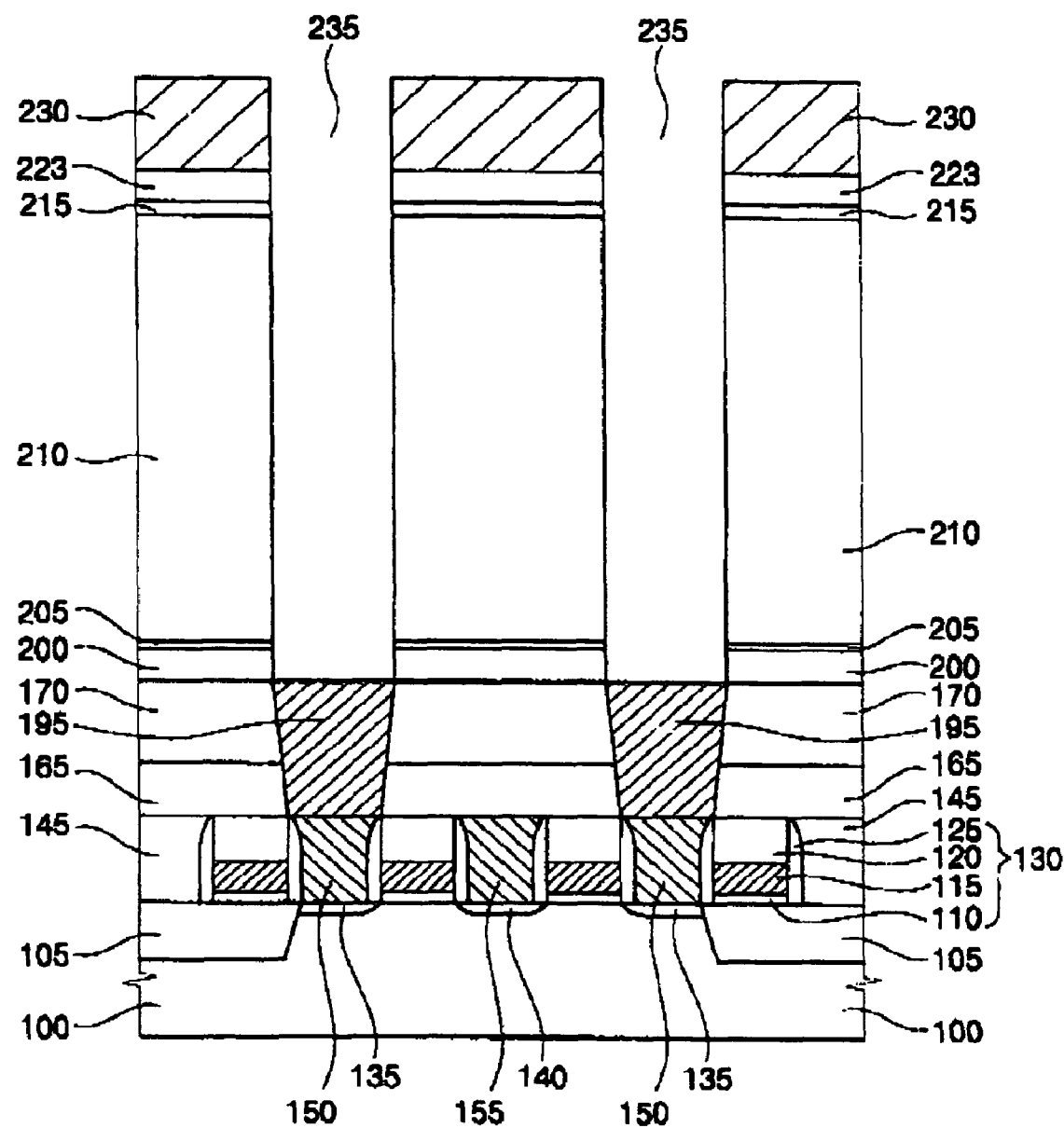
FIGS. 5A and 5B are cross-sectional views illustrating the formation of a storage mask pattern and fourth contact holes.
Figure 5B:
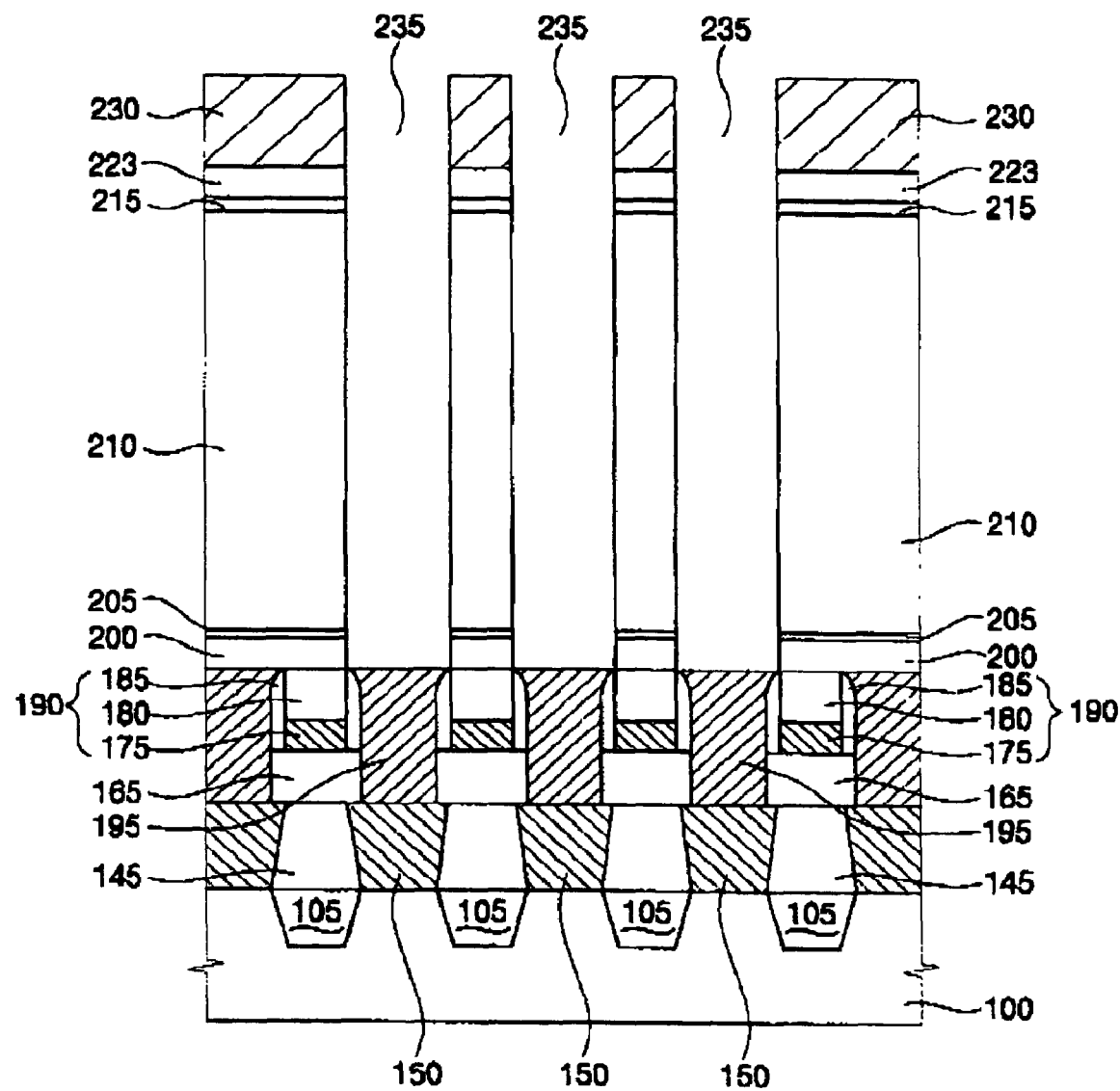

The bit line mask pattern 180 protects the bit line conductive pattern 175 in a successive etching process used to form fourth contact hole 235 (see FIGS. 5A and 5B). The bit line mask pattern 180 is formed using material having an etch selectivity relative to oxide. For example, the bit line mask pattern 180 is typically formed using nitride such as silicon nitride.

According to one embodiment of the present invention, the second mask layer is patterned using the fourth photoresist pattern as an etching mask to form the bit line mask pattern 180 on the third conductive layer. The fourth photoresist pattern is removed and then the third conductive layer is patterned using the bit line mask pattern 180 as an etching mask to form the bit line conductive pattern 175 on the second insulating interlayer 165. The third pads are simultaneously formed in the second contact holes, electrically connecting the bit line conductive patterns 175 to the second pads 155.

Referring to FIGS. 3A and 3B, a second insulation layer (not shown) is formed on the second insulating interlayer 165 to cover the bit lines 190. The second insulation layer is anisotropically etched to form second spacers 185 on sidewalls of the bit lines 190. The second spacers 185 correspond to bit line spacers. The second spacers 185 protect the bit lines 190 in a subsequent etching process used to form the fourth pads 195 corresponding to second storage node contact pads. The second spacers 185 typically include material having an etch selectivity relative to the second insulating interlayer 165 and a third insulating interlayer 170 successively formed. For example, the second spacers 185 typically include nitride such as silicon nitride.

A third insulating interlayer 170 is formed on the second insulating interlayer 165 to cover the bit lines 190, which include the second spacers 185. Third insulating interlayer 170 is typically formed using BPSG, PSG, TEOS, USG, SOG, or HDP-CVD oxide. Third insulating interlayer 170 is typically formed using material substantially identical to that of the second insulating interlayer 165 and/or that of the first insulating interlayer 145. Alternatively, the third insulating interlayer 170 often includes material substantially different from that of the second insulating interlayer 165 and/or the first insulating interlayer 145. Preferably, the third insulating interlayer 170 is formed using HDP-CVD oxide to advantageously fill gaps among the bit lines 190 without voids therein. Preferably, insulating interlayer is formed at a low temperature.

The third insulating interlayer 170 is typically etched by a CMP process, an etch-back process, or a combination of a CMP process and an etch-back process until the upper faces of the bit lines 190 are exposed, thereby planarizing the third insulating interlayer 170.

A fifth photoresist pattern (not shown) is formed on the third insulating interlayer 170. The third insulating interlayer 170 and the second insulating interlayer 165 are partially etched using the fifth photoresist pattern as an etching mask to form third contact holes 193 through the third insulating interlayer 170 and the second insulating interlayer 165. The third contact holes 193 expose the first pads 150, which correspond to the first storage node contact pads. The third contact holes 193 are self-aligned relative to the second spacers 185 positioned on the sidewalls of the bit lines 190.

In one embodiment of the present invention, an additional ARL is formed on the third insulating interlayer 170 to ensure a process margin for a subsequent photolithography process. In another embodiment of the present invention, after the third contact holes 193 are formed, a cleaning process is performed about the semiconductor substrate 100 and the resultant structure formed thereon. The cleaning process is adapted to remove a native oxide layer or various particles existing on the first pads 150.

A fourth conductive layer (not shown) is formed on the third insulating interlayer 170 to fill the third contact holes 193. The fourth conductive layer is etched by a CMP process, an etch-back process, or a combination of a CMP process and an etch-back process to form fourth pads 195, which fill the third contact holes 193. The fourth pads 195 correspond to second storage node contact pads. The fourth pads 195 are generally formed using polysilicon doped with impurities. Each of the fourth pads 195 electrically connects the first pad 150 to a storage electrode 255 (see FIGS. 7A and 7B) successively formed on the fourth pad 195. The storage electrodes 255 are electrically connected to the first pads 150 through the fourth pads 195.

Figure 4A:
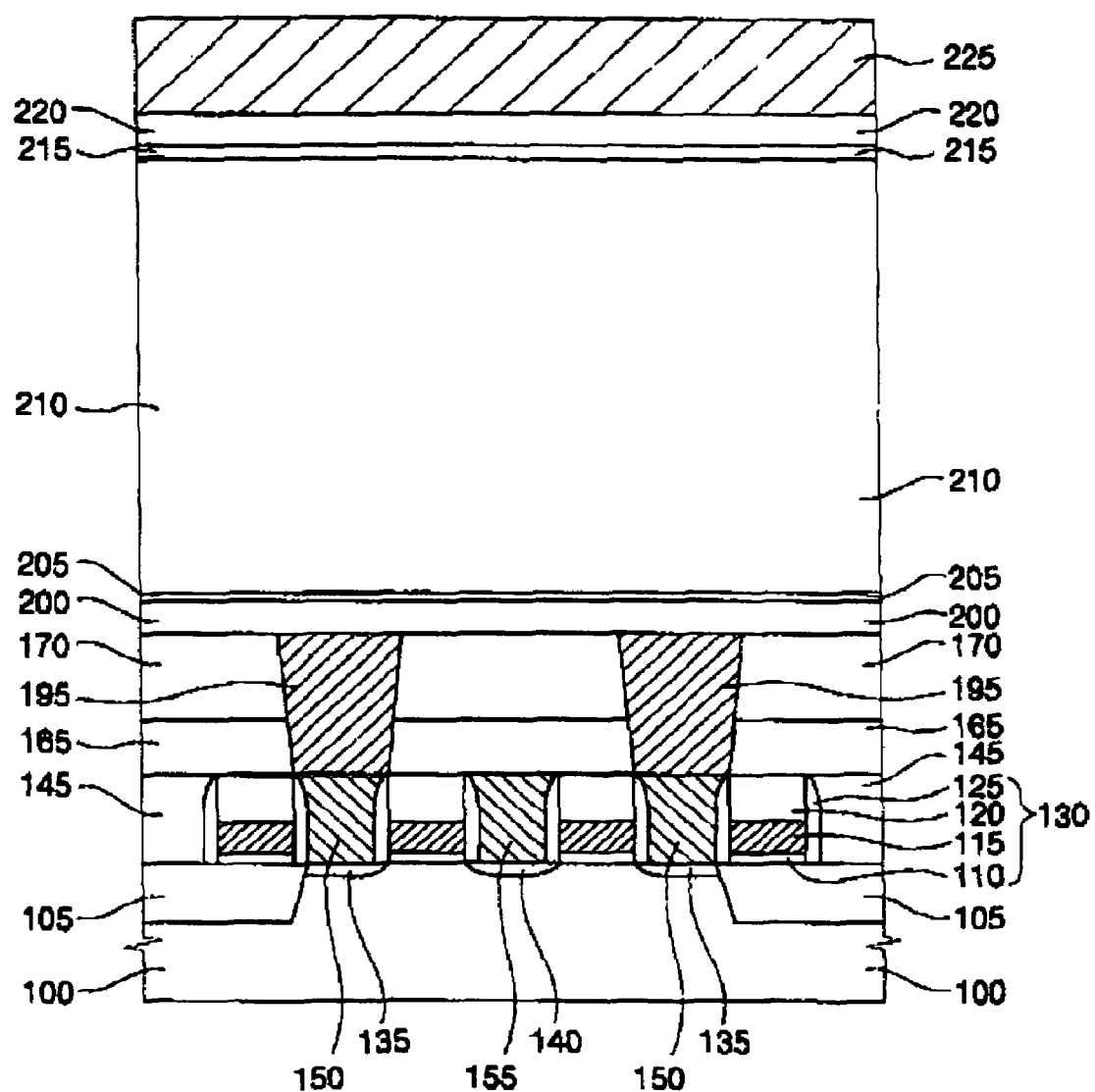
FIGS. 4A and 4B are cross-sectional views illustrating the formation of a fourth insulating interlayer, a first etch-stop layer, a mold layer, and a third mask layer.
Figure 4B:
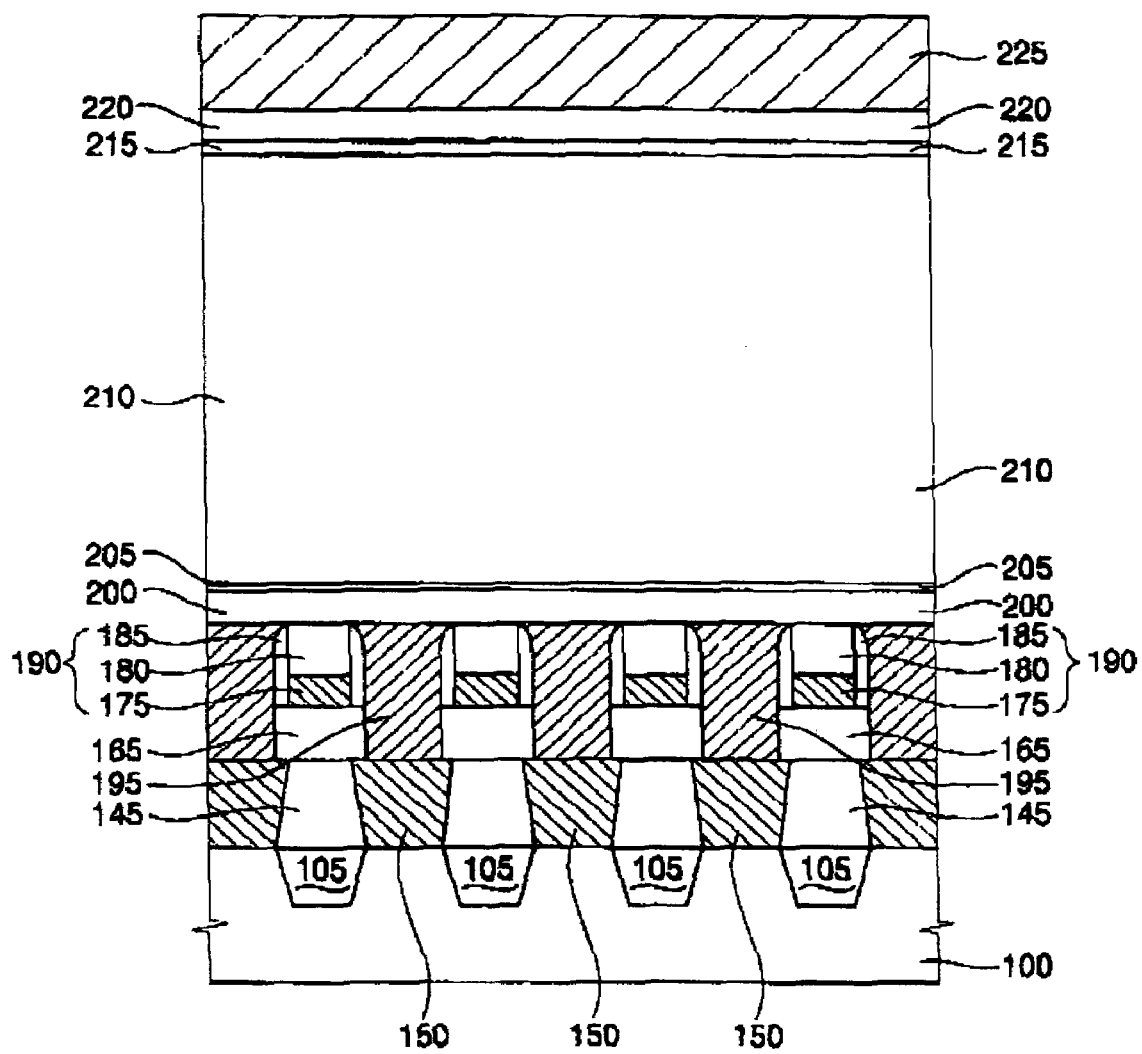

FIGS. 4A and 4B are cross-sectional views illustrating the formation of a fourth insulating interlayer 200, etch-stop layers 205 and 215, a mold layer 210 and a third mask layer 220.

Referring to FIGS. 4A and 4B, the fourth insulating interlayer 200 is formed on the third insulating interlayer 170 and the fourth pads 195. The fourth insulating interlayer 200 is typically formed using BPSG, PSG, SOG, USG, TEOS, or HDP-CVD oxide. The fourth insulating interlayer 200 electrically isolates the bit lines 190 from the storage electrodes 255. The fourth insulating interlayer 200 is typically formed using material substantially identical to that of the third insulating interlayer 170 and/or that of the second insulating interlayer 165. However, the fourth insulating interlayer 200 is often formed using material substantially different from that of the third insulating interlayer 170 and/or that of the second insulating interlayer 165.

The first etch-stop layer 205 is formed on the fourth insulating interlayer 200. The first etch-stop layer 205 is preferably formed using material having an etch selectivity relative to the fourth insulating interlayer 200 and the mold layer 210. For example, the first etch-stop layer 205 is typically formed using nitride such as silicon nitride.

The fourth insulating interlayer 200 is generally planarized by a CMP process, an etch-back process, or a combination of a CMP process and an etch-back process. The first etch-stop layer 205 is generally formed on the fourth insulating interlayer 200 after the fourth insulating interlayer 200 is planarized.

The mold layer 210 is formed on the first etch-stop layer 205. The mold layer 210 is preferably formed using HDP-CVD oxide, plasma enhanced TEOS (PE-TEOS), USG, BPSG, or PSG. The mold layer 210 has a thickness of about 5,000 to 50,000 Å from an upper face of the first etch-stop layer 205. The thickness of the mold layer 210 varies according to a desired capacitance of capacitors 270. Because the capacitors 270 have height in proportion to the thickness of the mold layer 210, the capacitance of the capacitors 270 can be controlled by adjusting the thickness of the mold layer 210.

In one embodiment of the present invention, the mold layer 210 is directly formed on the fourth insulating interlayer 200 without forming the first etch-stop layer 205.

The second etch-stop layer 215 is formed on the mold layer 210. The second etch-stop layer 215 is preferably formed using material having an etch selectivity relative to the mold layer 210. Additionally, the second etch-stop layer 215 preferably has an etch selectivity relative to a third mask layer 220 formed thereon. Where the mold layer 210 includes oxide and the third mask layer 220 includes polysilicon, the second etch-stop layer 215 typically includes silicon oxide or silicon oxynitride. The second etch-stop layer 215 is preferably formed using silicon nitride having a relatively low etching ratio during a CMP process because the second etch-stop layer 215 serves as a polishing stop layer in the CMP process. The second etch-stop layer 215 has a thickness of about 10 to 3,000 Å from an upper face of the mold layer 210.

The third mask layer 220 is formed on the second etch-stop layer 215. The third mask layer 220 is typically formed using material having an etch selectivity relative to the second etch-stop layer 215 as described above. For example, the third mask layer 220 typically includes polysilicon. The third mask layer 220 has a thickness of about 1,000 to 6,000 Å from an upper face of the second etch-stop layer 215. A ratio of the thickness of the second etch-stop layer 215 relative to that of the third mask layer 220 is preferably in a range of about 1:5 to 1:10. However, the ratio of the thickness of the second etch-stop layer 215 relative to that of the third mask layer 220 varies according to the capacitance of the capacitors 270. In the present invention, the second etch-stop layer 215 is generally minimally consumed in the CMP process for forming the storage electrodes 255. The second etch-stop layer 215 is typically readily removed after the storage electrodes 255 are formed. A thickness ratio between the second etch-stop layer 215 and a storage electrode mask 223 (see FIGS. 5A and 5B) has a range from about 0.2:1 to 0.35:1. For example, where the storage electrode mask 223 has a typical thickness of about 1,000 to 6,000 Å, the second etch-stop layer 215 has a typical thickness of about 200 to 2,100 Å.

According to one aspect of the present invention, the mold layer 210 is planarized by a CMP process, an etch-back process, or a combination of a CMP process and an etch-back process. The second etch-stop layer 215 and the third mask layer 220 are typically formed on the planarized mold layer 210.

Referring to FIGS. 4A and 4B, a photoresist film 225 is formed on third mask layer 220 to form a storage electrode mask 223 on the second etch-stop layer 220.

FIGS. 5A and 5B are cross-sectional views illustrating the formation of a storage mask pattern 223 and fourth contact holes 235.

Referring to FIGS. 5A and 5B, after the photoresist film 225 is formed on the third mask layer 220, the photoresist film 225 is exposed and developed to form a sixth photoresist pattern 230 on the third mask layer 220.

The third mask layer 220 is partially etched using the sixth photoresist pattern 230 as an etching mask, thereby forming the storage electrode mask 223 on the second etch-stop layer 215.

The second etch-stop layer 215, the mold layer 210, the first etch-stop layer 205 and the fourth insulating interlayer 200 are partially etched using the storage electrode mask 223 as an etching mask. As a result, the fourth contact holes 235 are formed to expose the fourth pads 195. The fourth contact holes 235 correspond to storage electrode contact holes for forming the storage electrodes 255. The sixth photoresist pattern 230 is typically substantially consumed in the process of forming the fourth contact holes 235. However, an additional ashing and/or stripping process is often performed in order to completely remove the six photoresist pattern 230 from the storage electrode mask 223.

Figure 6A:
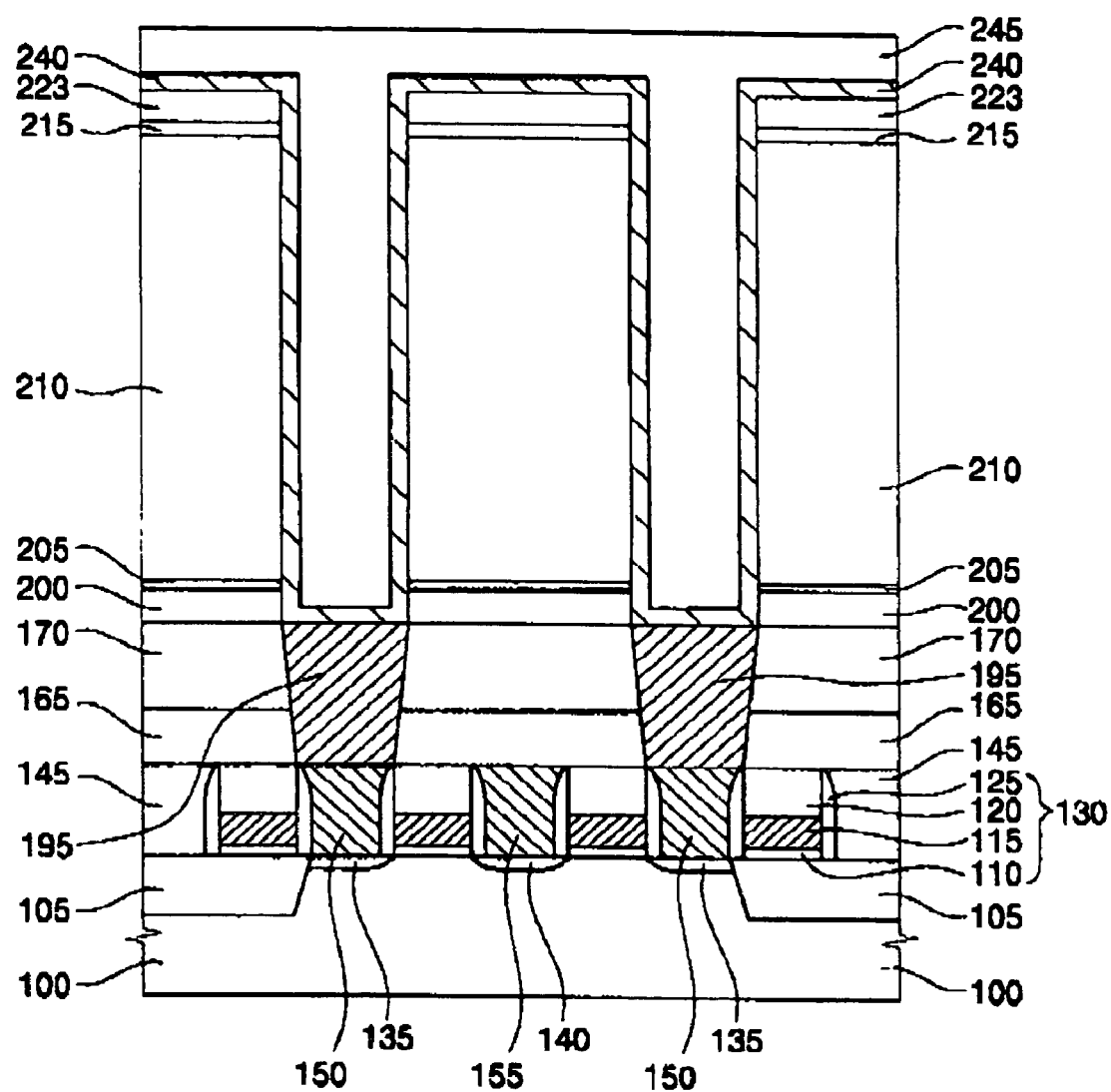
FIGS. 6A and 6B are cross-sectional views illustrating the formation of a fifth conductive layer and a sacrificial layer.
Figure 6B:
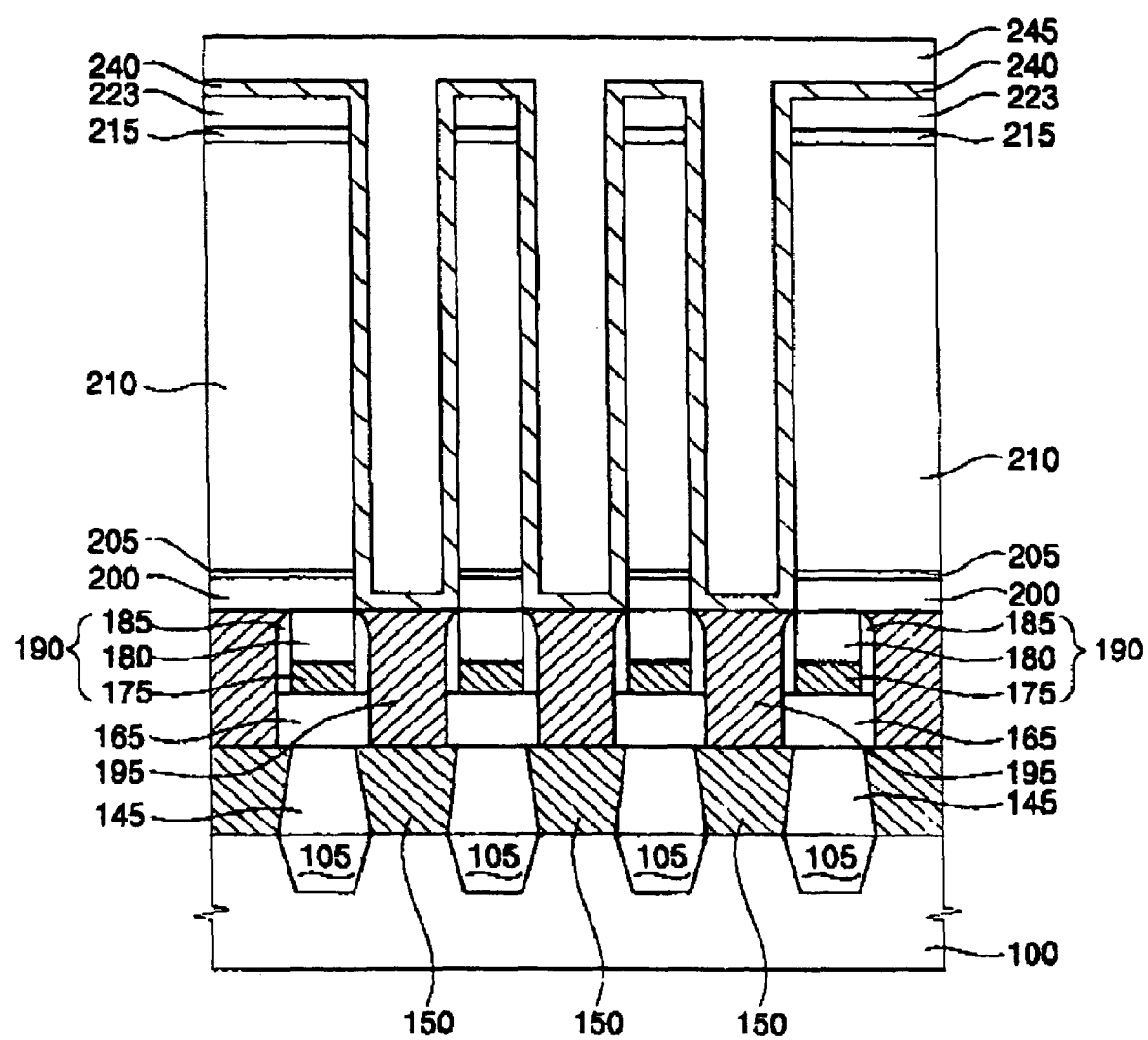

FIGS. 6A and 6B are cross-sectional views illustrating the formation of a fifth conductive layer 240 and a sacrificial layer 245.

Referring to FIGS. 6A and 6B, the fifth conductive layer 240 is formed on the exposed fourth pads 195, on the inner sidewalls of the fourth contact holes 235, and on the storage electrode mask 223. The fifth conductive layer 240 is typically formed using conductive material such as doped polysilicon, titanium/titanium nitride, or copper.

The sacrificial layer 245 is formed on the fifth conductive layer 240 to fill the fourth contact holes 235. The sacrificial layer 245 protects the storage electrodes 255 in subsequent processes, and is later removed after the storage electrodes 255 are completely formed. The sacrificial layer 245 is preferably formed using BPSG, USG, PSG, TEOS, or HDP-CVD oxide. In some cases, the sacrificial layer 245 is planarized by a CMP process, an etch-back process or a combination of a CMP process and an etch-back process.

Figure 7A:
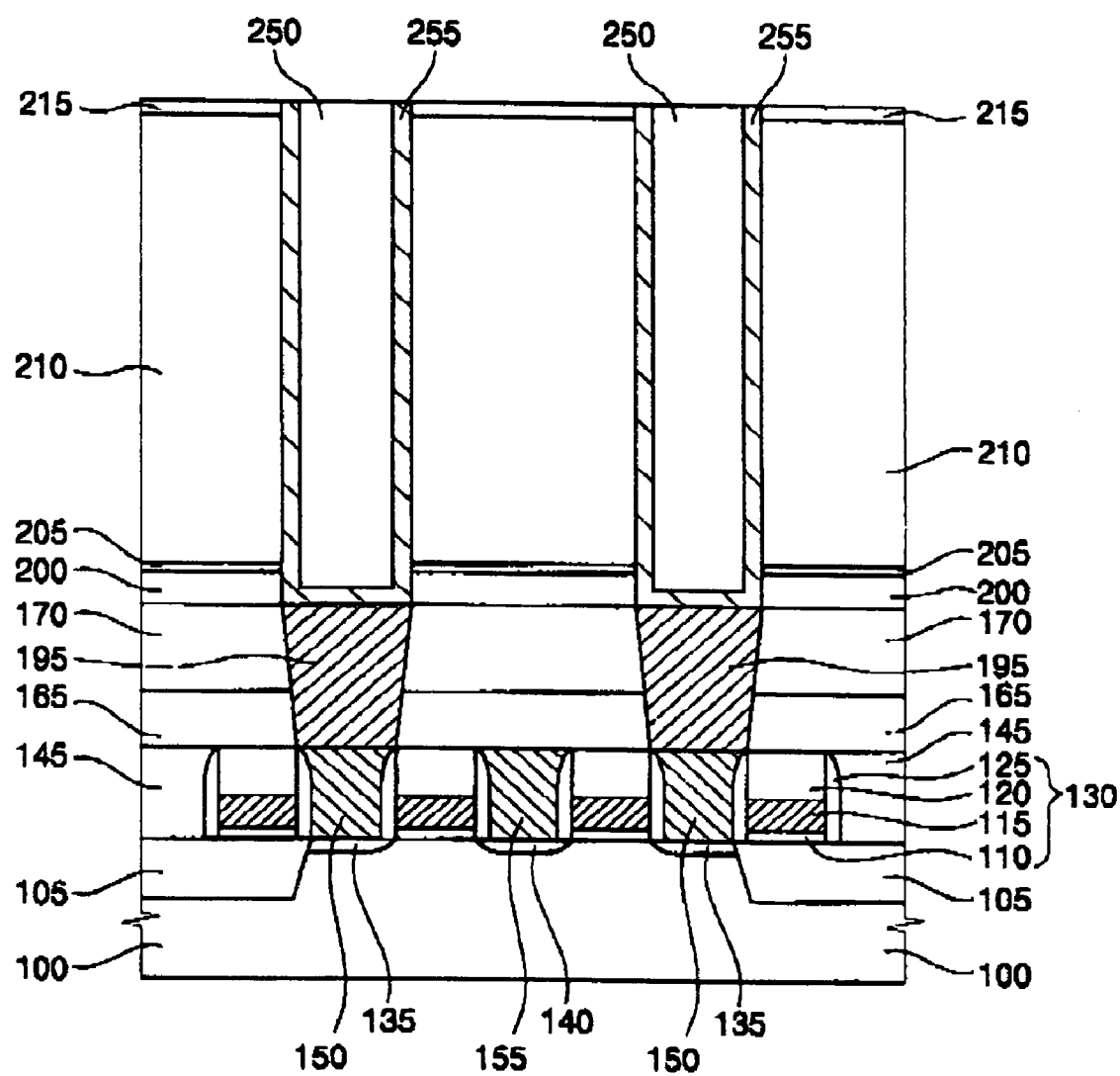
FIGS. 7A and 7B are cross-sectional views illustrating the formation of storage electrodes.
Figure 7B:
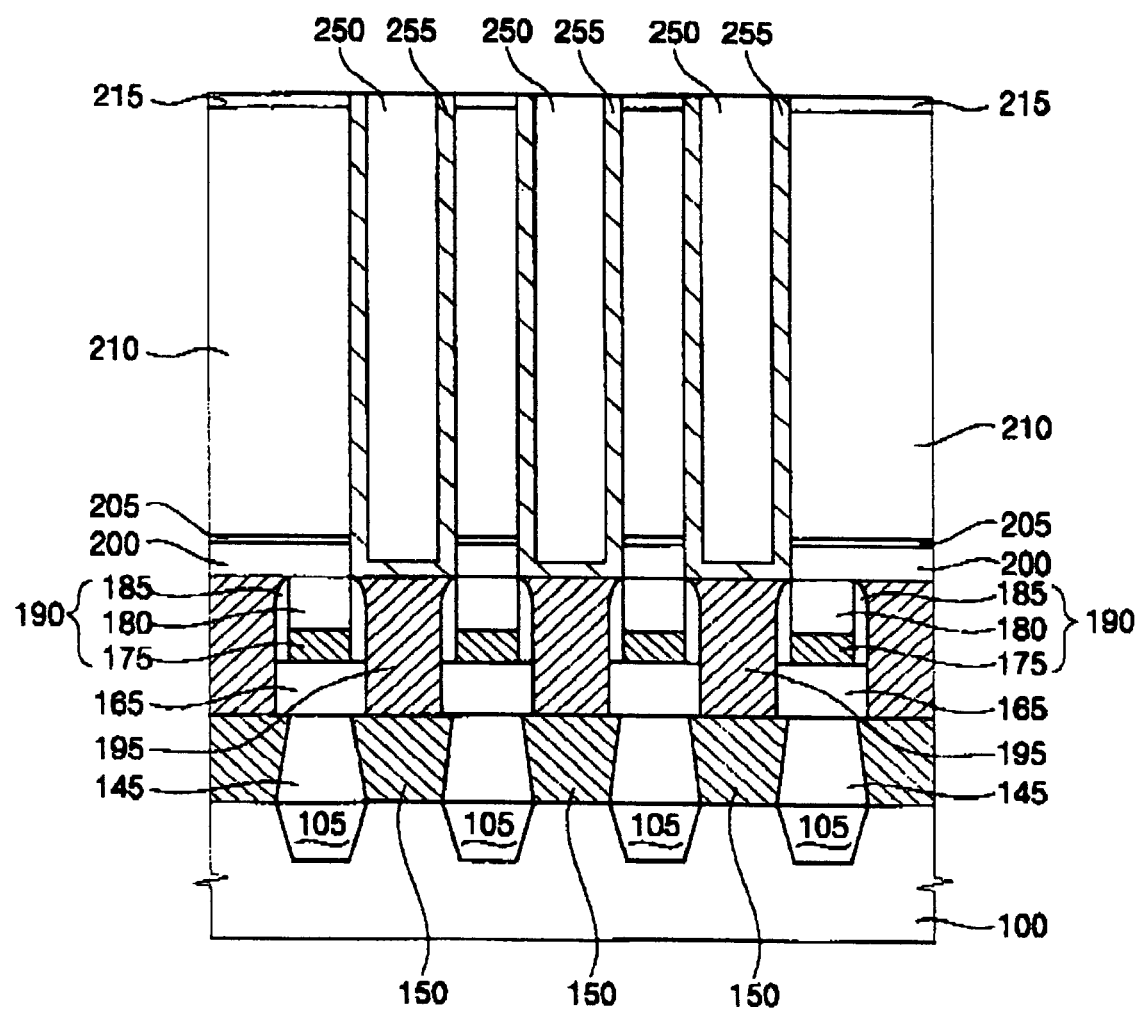

FIGS. 7A and 7B are cross-sectional views illustrating the formation of the storage electrodes 255.

Referring to FIGS. 7A and 7B, upper portions of the sacrificial layer 245, the fifth conductive layer 240, and the storage electrode mask 223 are etched until the second etch-stop layer 215 is exposed, using a CMP process, an etch-back process, or a combination of a CMP process and an etch-back process. The storage electrodes 255 and the sacrificial layer patterns 250 are thus simultaneously formed in the fourth contact holes 235. The storage electrodes 255 are electrically connected to the fourth pads 195 and the sacrificial layer patterns 250 fill the fourth contact holes 235. When the upper portions of the sacrificial layer 245, the fifth conductive layer 240, and the storage electrode mask 223 are removed by the CMP process, a slurry having an etch selectivity relative to one of oxide, polysilicon, and silicon nitride is typically employed. However, a slurry comprising an abrasive of cerium oxide ($CeO_2$) or silicon oxide ($SiO_2$) is often employed in the CMP process. The slurry preferably includes a passivation agent of about 1.6 to 2.1 percent by weight, an adhesive of about 0.5 to 2.0 percent by weight, tertiary amine of about 0.2 to 0.8 percent by weight, a pH control agent of about 7 to 9 percent by weight, and deionized water of about 86.1 to 90.7 percent by weight. The passivation agent preferably includes polyethylenimine, polyvinyl sulfonic acid, polycarboxylic acid, polyethylenimine salt, polyvinyl sulfonate, or polycarboxylate. The abrasive preferably includes aluminum oxide ($Al_2O_3$), titanium oxide ($TiO_2$), zirconium oxide ($ZrO_2$), germanium oxide ($GeO_2$), cerium oxide or silicon oxide. The tertiary amine preferably includes choline or tetramethyl ammonium hydroxide. The pH control agent preferably includes ammonium hydroxide or calcium hydroxide. The slurry having the above-described composition is preferably employed in the CMP process until second etch-stop layer 215 is exposed by completely removing the storage electrode mask 223.

According to one aspect of the present invention, after the upper portion of the sacrificial layer 245 is etched by a CMP process, an etch-back process, or a combination of a CMP process and an etch-back process, the upper portions of the fifth conductive layer 240 and the storage electrode mask 223 are removed after the second etch-stop layer 215 is exposed.

Figure 8A:
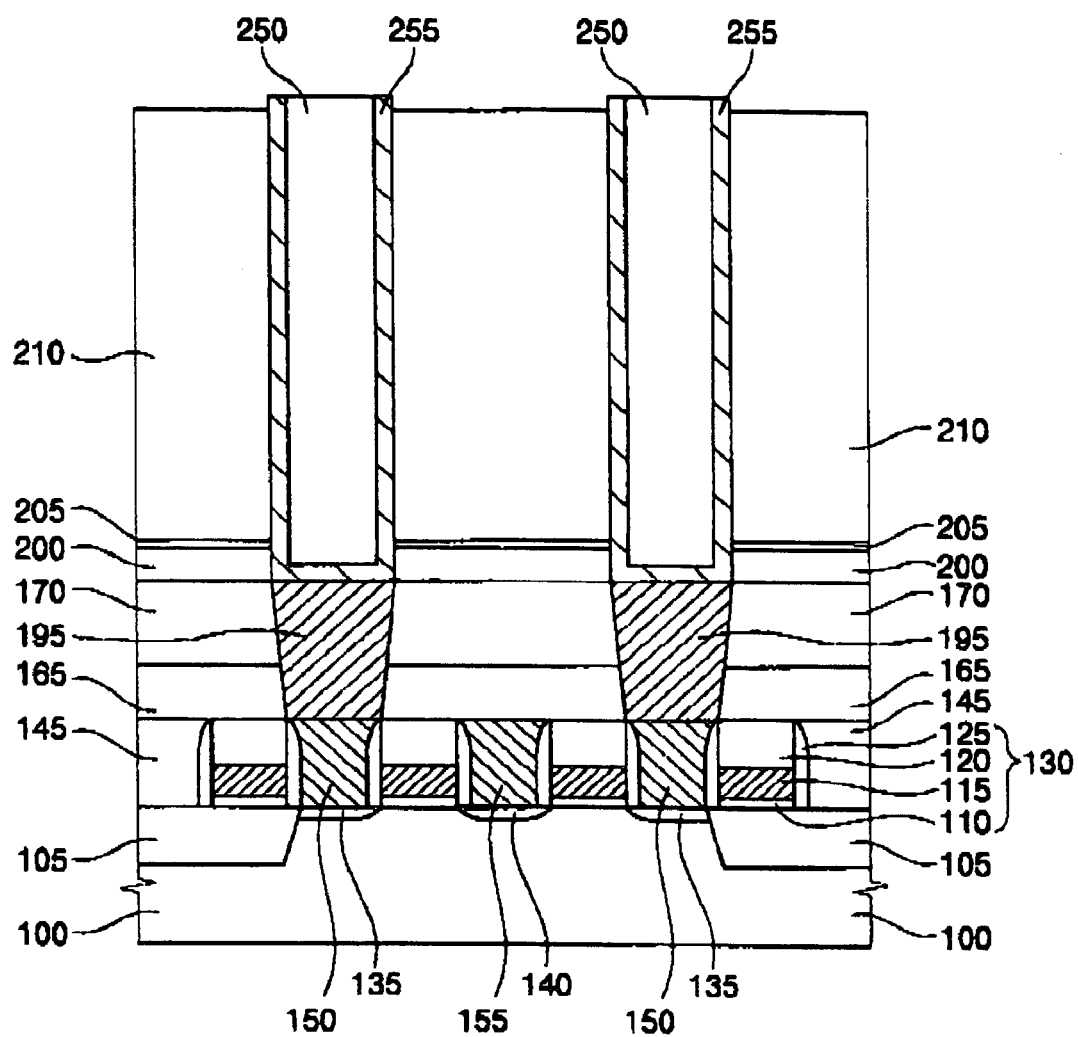
FIGS. 8A and 8B are cross-sectional views illustrating the removal of a second etch-stop layer 215.
Figure 8B:
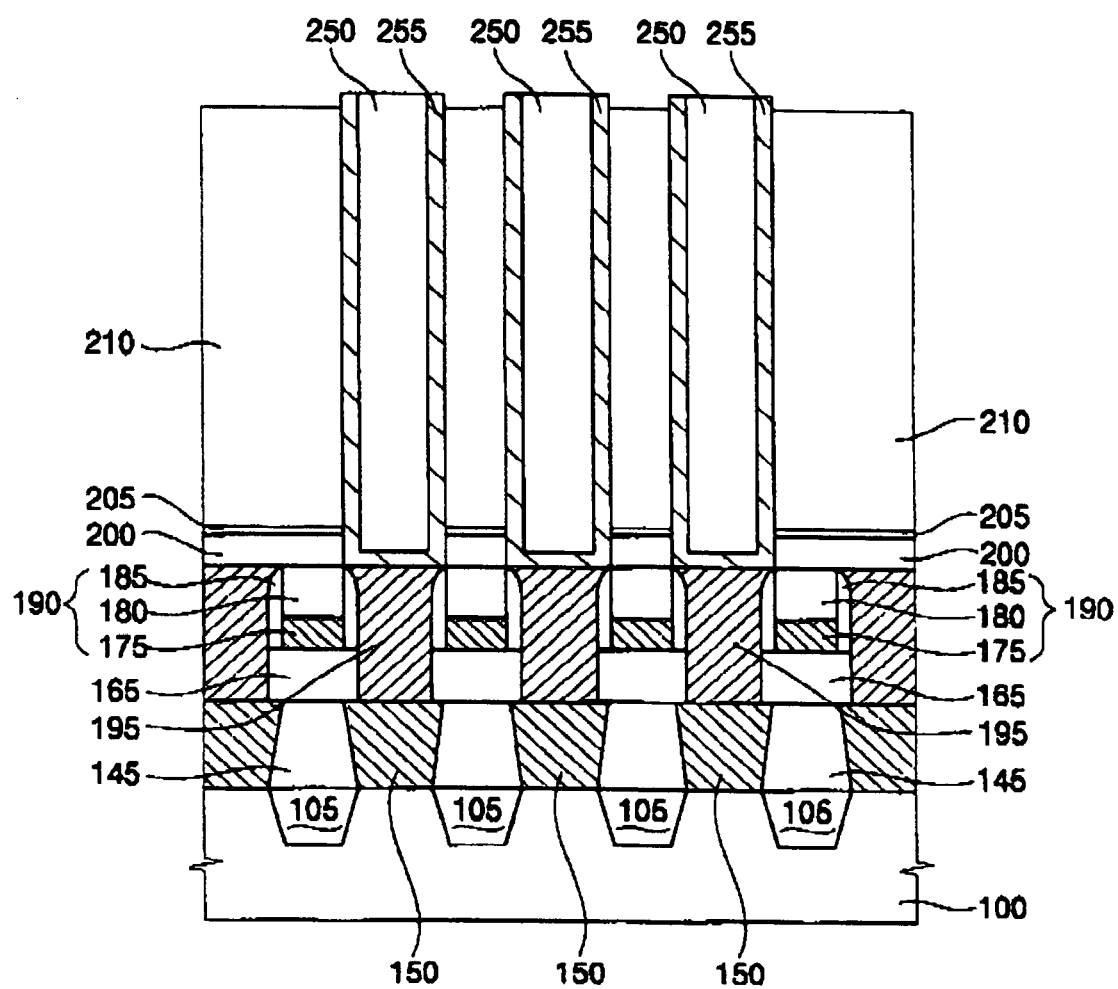

FIGS. 8A and 8B are cross-sectional views illustrating the removal of the second etch-stop layer 215.

Referring to FIGS. 8A and 8B, the second etch-stop layer 215 is removed by a dry etching process or a wet etching process. As a result of removing the second etch-stop layer 215, upper portions of the storage electrodes 255 and the sacrificial layer patterns 250 are exposed. Where the second etch-stop layer 215 is removed by the dry etching process, the dry etching process uses an etching gas including carbon and fluorine such as CxFy. For example, the second etch-stop layer 215 is often removed using $CF_4$, $C_3F_6$, $C_4F_6$ or $C_5F_8$. Where the second etch-stop layer 215 is removed by the wet etching process, the wet etching process uses an etching solution that includes phosphoric acid. The storage electrodes 255, the mold layer 210 and the sacrificial layer patterns 250 are not removed during removal of the second etch-stop layer 215 because the storage electrodes 255, the mold layer 210 and the sacrificial layer patterns 250 have etch selectivity relative to the second etch-stop layer 215. As a result, upper portions of the storage electrodes 255 protrude from the mold layer 210 by the thickness of the second etch-stop layer 215. More specifically, the upper portions of the storage electrodes 255 protrude from the mold layer 210 by a height of about 10 to 3,000 Å. Also, the sacrificial layer patterns 250 protrude from the mold layer 210 by a height of about 10 to 3,000 Å so that the sacrificial layer patterns 250 effectively protect the storage electrodes 255 in a subsequent etching process.

In the conventional method for forming a capacitor, because an upper portion of a storage electrode is removed (i.e., damaged) with a storage electrode mask during a CMP process used to form the storage electrode, the effective area of the storage electrode is reduced, thereby reducing the overall capacitance of the capacitor. According to the present invention, however, the storage electrodes 255 are not damaged during the CMP process because the second etch-stop layer 215 serves as the polishing stop layer for the CMP process, which is used in part to form the storage electrodes 255. As a result, the capacitor 270 has improved capacitance relative to the conventional capacitor due to an increase in the effective area of the storage electrode 255.

Figure 9A:
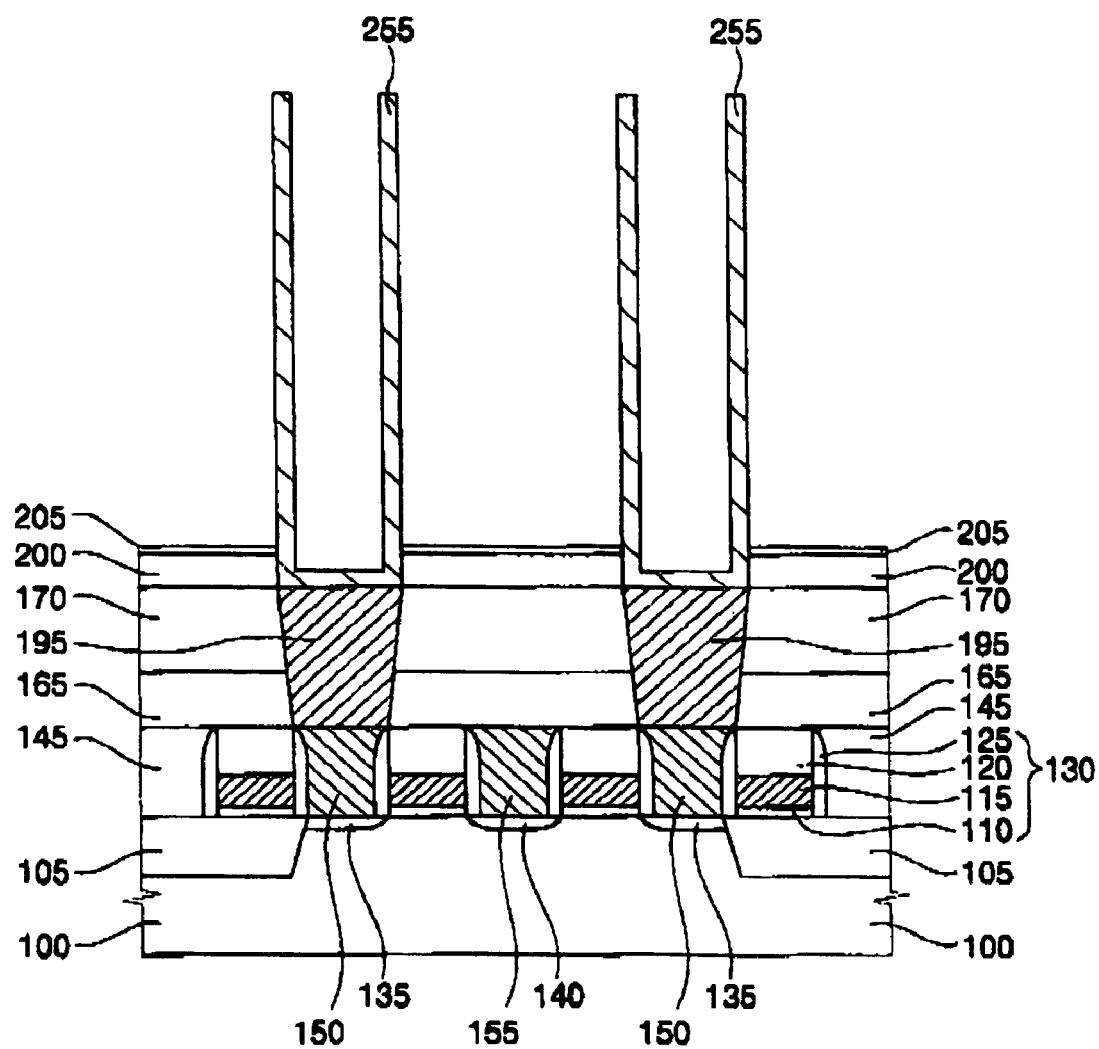
FIGS. 9A and 9B are cross-sectional views illustrating the removal of sacrificial layer patterns and the mold layer.
Figure 9B:
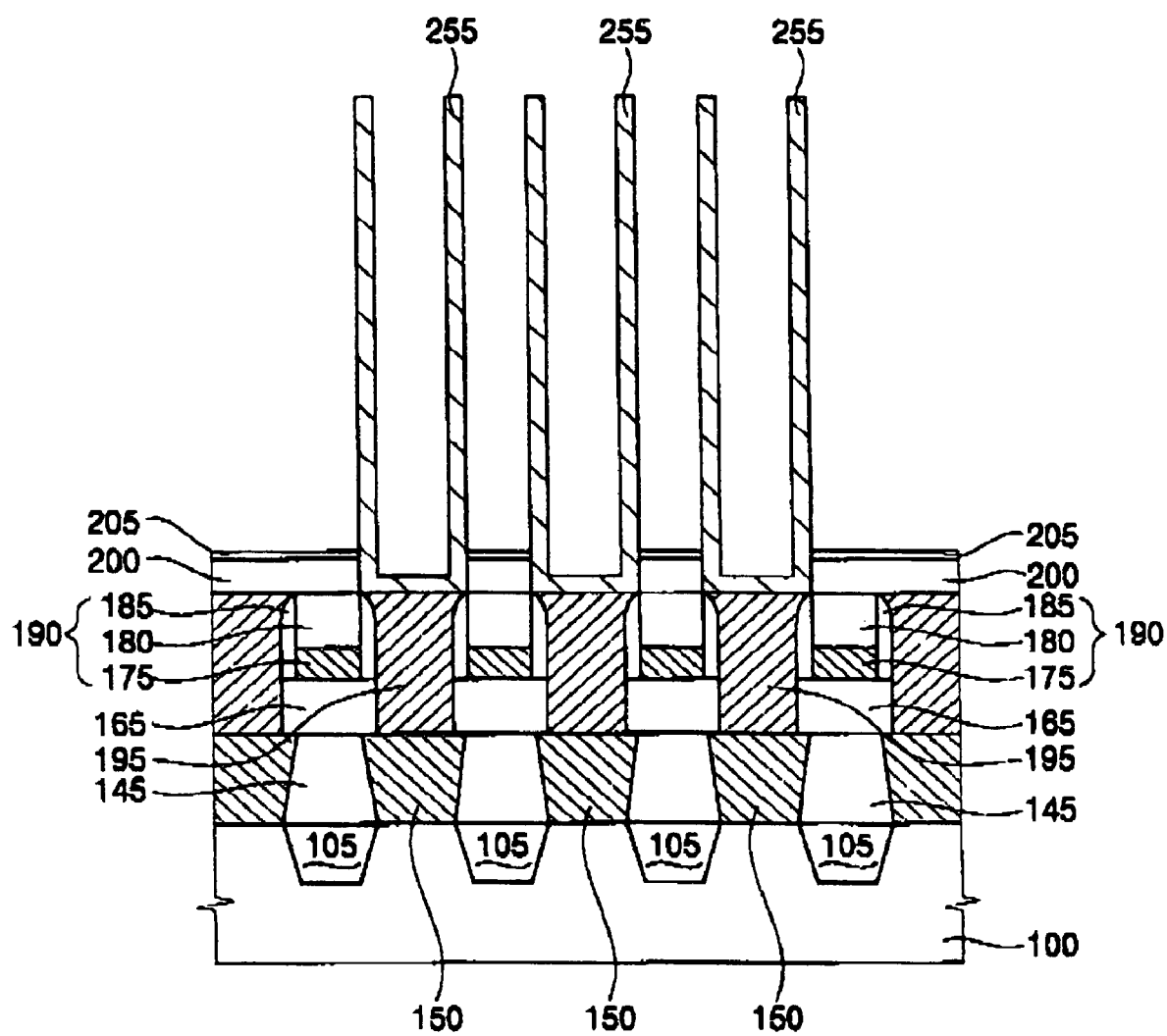

FIGS. 9A and 9B are cross-sectional views illustrating the removal of the sacrificial layer patterns 250 and the mold layer 210.

Referring to FIGS. 9A and 9B, the sacrificial layer patterns 250 and the mold layer 210 are successively removed by a wet etching process or a dry etching process to thereby form the storage electrodes 255, which contact the fourth pads 195. The storage electrodes 255 have increased area relative to the area of the conventional capacitor because the upper portions of the storage electrodes 255 are not damaged by the CMP process.

Figure 10A:
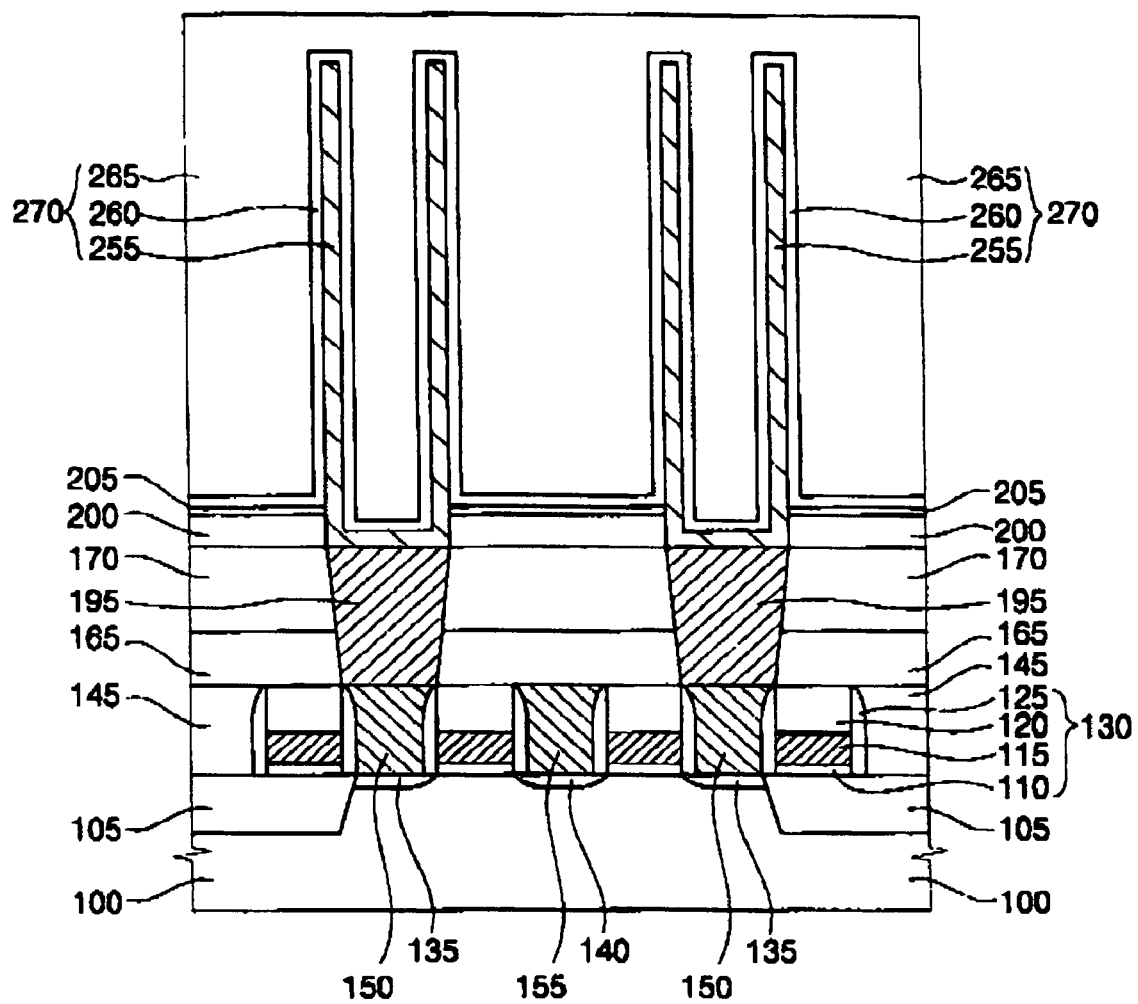
FIGS. 10A and 10B are cross-sectional views illustrating the formation of the capacitor.
Figure 10B:
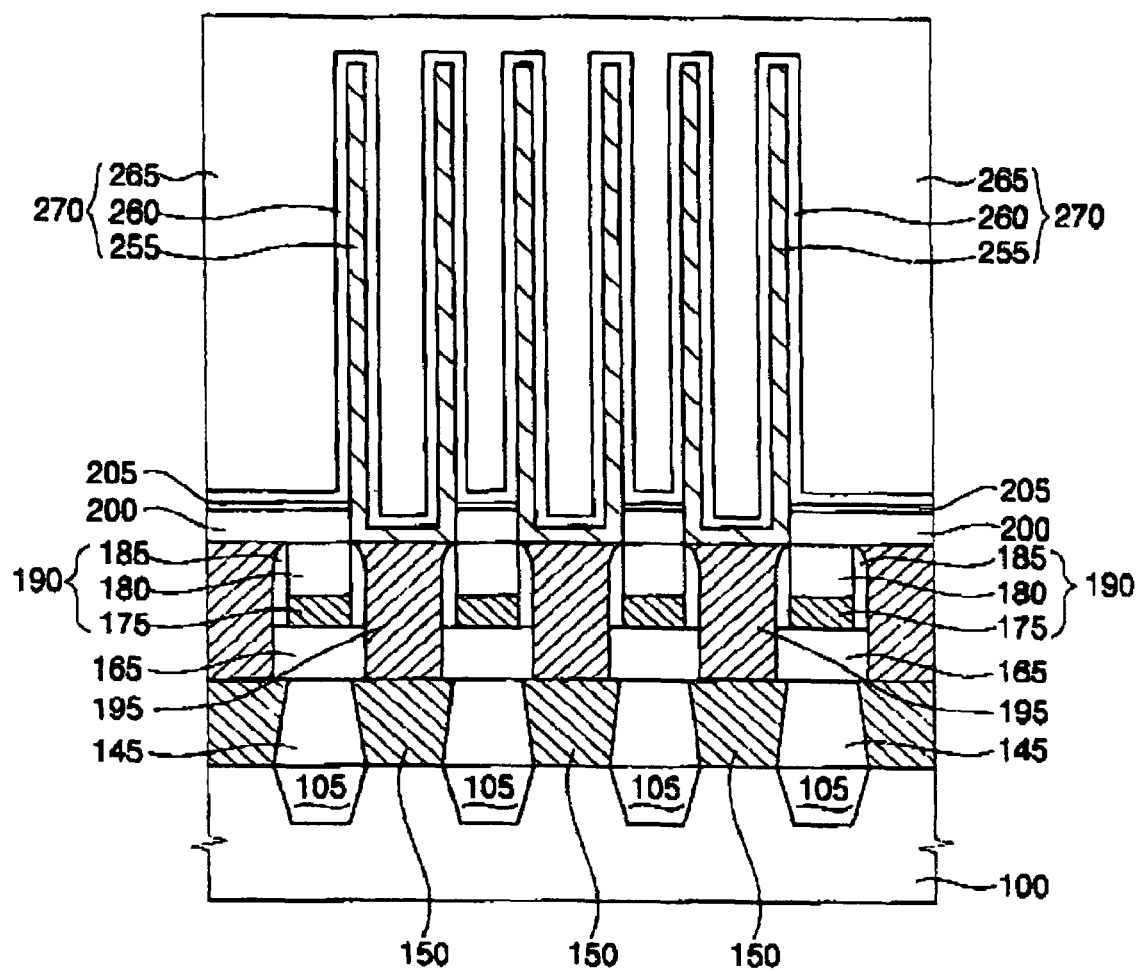

FIGS. 10A and 10B are cross-sectional views illustrating the formation of the capacitors 270.

Referring to FIGS. 10A and 10B, dielectric layers 260 and plate electrodes 265 are successively formed on the storage electrodes 255, thereby forming the capacitors 270 over the semiconductor substrate 100.

A fifth insulating interlayer (not shown) is formed on the capacitors 270 to electrically isolate the capacitors 270 from an upper wiring (not shown) successively formed thereon. Once the upper wiring is formed on the fifth insulating interlayer, formation of the semiconductor device including the capacitors 270 is completed.

According to the present invention, an additional etch-stop layer or a polishing stop layer is employed to protect a storage electrode of a capacitor during its fabrication. The storage electrode, particularly an upper portion of the storage electrode, may be effectively protected by the additional etch-stop layer or polishing stop layer, thereby improving the overall capacitance of the capacitor.

In addition, because the additional etch-stop layer or the polishing stop layer has a proper thickness relative to a storage electrode mask used in forming the storage electrode, the storage electrode is not damaged. Subsequently, additional etch-stop layer or polishing stop layer is readily removed.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. A method of manufacturing a capacitor, comprising:
   forming a first etch-stop layer and a mold layer on a semiconductor substrate including a conductive structure;
   forming a second etch-stop layer on the mold layer;
   forming a mask on the second etch-stop layer;
   using the mask, forming a contact hole through the second etch stop layer to expose the conductive structure;
   forming a storage electrode contacting the conductive structure in the contact hole; and,
   forming a dielectric layer and a plate electrode on the storage electrode, wherein forming the mask comprises:
     forming a mask layer on the second etch-stop layer;
     forming a photoresist pattern on the mask layer; and,
     patterning the mask layer using the photoresist pattern to form the mask.

2. A method of manufacturing a capacitor, comprising:
   forming a first etch-stop layer and a mold layer on a semiconductor substrate including a conductive structure;
   forming a second etch-stop layer on the mold layer;
   forming a mask on the second etch-stop layer;
   using the mask, forming a contact hole through the second etch stop layer to expose the conductive structure;
   forming a storage electrode contacting the conductive structure in the contact hole; and,
   forming a dielectric layer and a plate electrode on the storage electrode, wherein forming the storage electrode comprises:
     forming a conductive layer on the conductive structure, on inner sidewalls of the contact hole, and on the mask;
     removing the mask until the second etch-stop layer is exposed;
     removing the second etch-stop layer; and
     removing the mold layer.

3. The method of claim 2, wherein a thickness ratio between the second etch-stop layer and the mask ranges from between about 0.1:1 to 0.5:1.

4. The method of claim 3, wherein the second etch-stop layer has a thickness of about 10 to 3,000 Å.

5. The method of claim 2, wherein forming the storage electrode further comprises:
   forming a sacrificial layer on the conductive layer.

6. The method of claim 5, wherein removing the mold layer simultaneously removes the sacrificial layer.

7. The method of claim 2, wherein the second etch-stop layer is formed from a material having an etch selectivity relative to the mold layer and the mask.

8. The method of claim 7, wherein the mold layer comprises oxide and the second etch-stop layer comprises nitride.

9. The method of claim 2, wherein removing the mask comprises performing a chemical mechanical polishing (CMP) process, an etch-back process, or a combination of a CMP process and an etch-back process.

10. The method of claim 9, wherein removing the mask further comprises using a slurry having an etch selectivity relative to the mold layer and the second etch-stop layer.

11. The method of claim 10, wherein removing the second etch-stop layer comprises performing a wet etching process using an etching solution including phosphoric acid.

12. The method of claim 2, wherein removing the second etch-stop layer comprises performing a dry etching process using an etching gas including carbon and fluorine.

13. The method of claim 2, wherein following removal of the second etch-stop layer, an upper portion of the storage electrode protrudes by a thickness corresponding to a thickness of the second etch-stop layer.

14. A method of manufacturing a capacitor comprising:
forming an etch-stop layer and a mold layer on a semiconductor substrate including a conductive structure;
forming a polishing stop layer on the mold layer;
forming a mask on the polishing stop layer;
using the mask, forming a contact hole through the polishing stop layer to expose the conductive structure;
forming a conductive layer electrically connected to the conductive structure in the contact hole;
forming a storage electrode in the contact hole by removing the mask using a slurry having an etch selectively relative to the polishing stop layer and the mold layer until the polishing stop layer is exposed;
removing the polishing stop layer by performing a dry etching process using an etching gas comprising carbon and fluorine, or a wet etching process using an etching solution comprising phosphoric acid;
removing the mold layer; and
forming a dielectric layer and a plate electrode on the storage electrode.

15. The method of claim 14, wherein forming the storage electrode further comprises:
forming a sacrificial layer on the conductive layer to fill the contact hole; and,
simultaneously removing sacrificial layer with the mold layer.

16. The method of claim 14, wherein the polishing stop layer comprises a material having an etch selectivity relative to the mold layer and the mask.

17. A method for manufacturing a semiconductor device comprising:
forming first and a second contact regions on a semiconductor substrate;
forming a bit line electrically connected to the second contact region;
successively forming an insulating interlayer, a first etch-stop layer, and a mold layer on the semiconductor substrate including the bit line;
forming a second etch-stop layer on the mold layer;
forming a mask on the second etch-stop layer;
forming a contact hole exposing the first contact region by partially etching the second etch-stop layer, the mold layer, the first etch-stop layer, and the insulating interlayer using the mask;
forming a storage electrode in the contact hole; and
forming a dielectric layer and a plate electrode on the storage electrode.

18. The method of claim 17, wherein forming the storage electrode further comprises:
forming a conductive layer on the first contact region, on inner sidewalls of the contact hole, and on the mask;
forming a sacrificial layer on the conductive layer to fill the contact hole;
removing the mask until the second etch-stop layer is exposed;
removing the second etch-stop layer; and
removing the mold layer and the sacrificial layer.

19. The method of claim 18, wherein following removal of the second etch-stop layer, an upper portion of the storage electrode protrudes by a thickness corresponding to the second etch-stop layer.

20. The method of claim 18, wherein forming the second etch-stop layer comprises using a material having an etch selectivity relative to the mold layer and the mask.

21. The method of claim 18, wherein removing the mask comprises using a slurry having an etch selectivity relative to the second etch-stop layer and the mold layer.

22. The method of claim 18, wherein removing the second etch-stop layer comprises performing a dry etching process using an etching gas comprising carbon and fluorine or a wet etching process using an etching solution comprising phosphoric acid.

* * * * *